(12) United States Patent
Yoshizawa et al.

(10) Patent No.: US 7,132,720 B2
(45) Date of Patent: Nov. 7, 2006

(54) SEMICONDUCTOR DEVICE HAVING GUARD RING AND MANUFACTURING METHOD THEREOF

(75) Inventors: Kazutaka Yoshizawa, Kawasaki (JP);
Kazuki Sato, Kawasaki (JP);
Shinichiroh Ikemasu, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/650,810

(22) Filed: Aug. 29, 2003

(65) Prior Publication Data

US 2004/0042285 A1 Mar. 4, 2004

(30) Foreign Application Priority Data

Aug. 30, 2002 (JP) .............................. 2002-255332

(51) Int. Cl.
*H01L 29/94* (2006.01)

(52) U.S. Cl. ................................. 257/409; 257/E29.013

(58) Field of Classification Search ................ 257/409, 257/E29.013

See application file for complete search history.

(56) References Cited

U.S. PATENT DOCUMENTS

| | | | |
|---|---|---|---|
| 5,196,910 A | * | 3/1993 | Moriuchi et al. ........... 257/296 |
| 5,652,459 A | * | 7/1997 | Chen .......................... 257/529 |
| 6,498,089 B1 | * | 12/2002 | Komada ...................... 438/618 |
| 6,525,398 B1 | * | 2/2003 | Kim et al. ................... 257/529 |
| 6,683,329 B1 | * | 1/2004 | Moriya ........................ 257/127 |
| 2003/0193090 A1 | * | 10/2003 | Otani et al. ................. 257/758 |

FOREIGN PATENT DOCUMENTS

KR 2002017589 A * 3/2002

* cited by examiner

*Primary Examiner*—Tu-Tu Ho
(74) *Attorney, Agent, or Firm*—Westerman, Hattori, Daniels & Adrian, LLP.

(57) ABSTRACT

An interlayer insulation film is etched to form contact holes in an integrated circuit part. At this time, a trench is not formed in a guard ring part. Subsequently, ion implantation is carried out in source/drain regions in a peripheral circuit part for contact compensation, and high-temperature annealing is carried out in order to activate implanted impurities. Subsequently, an interlayer insulation film, a storage capacitor, and another interlayer insulation film are formed in sequence. Then, contact holes reaching a part of wiring layers are formed in the peripheral circuit part while, in the guard ring part, a trench reaching a diffusion layer is formed. Next, a barrier metal film is formed in each of the contact holes and the trench, and further, a contact plug comprising, for example, a W film is buried therein.

22 Claims, 32 Drawing Sheets

SEMICONDUCTOR DEVICE HAVING GUARD RING AND MANUFACTURING METHOD THEREOF

CROSS-REFERENCE TO RELATED APPLICATIONS

This application is based upon and claims the benefit of priority from the prior Japanese Patent Application No. 2002-255332, filed on Aug. 30, 2002, the entire contents of which are incorporated herein by reference.

BACKGROUND OF THE INVENTION

1. Field of the Invention

The present invention relates to a semiconductor device suitable for very large scale integration and a manufacturing method thereof.

2. Description of the Related Art

A DRAM (Dynamic Random Access Memory) is roughly defined into a memory cell array part having a memory cell array provided therein, a peripheral circuit part having drive circuits of memory cells and so on, and a dicing line part on an outer periphery of a chip. Between the peripheral circuit part and the dicing line part, a guard ring part is provided for the purpose of preventing moisture intrusion from the outside. Such a DRAM is manufactured by the following method. FIG. 25 to FIG. 30 are sectional views showing a manufacturing method of a semiconductor device in a prior art in the order of its steps.

First, as shown in FIG. 25, element isolation regions 112 are formed on a surface of a semiconductor substrate 111 through a generally known STI (Shallow Trench Isolation) process. Thereafter, ion implantation for forming wells, a channel stop diffusion layer (neither is shown), and so on is carried out. Next, a gate oxide film 113 is formed. Thereafter, a polycrystalline Si film and a WSi film are deposited in sequence, over which a SiN film and so on to be an insulation film layer are further deposited. Next, formation of a resist film, patterning of the resist film, and etching are conducted so that wiring layers 114 each constituted of a polycrystalline Si film 114a and a WSi film 114b, and a SiN film 145 are formed.

Next, ion implantation for forming an LDD (Lightly Doped Drain) structure is carried out to form a diffusion layer 115. Next, sidewalls 116 comprising $Si_3N_4$ are formed. Next, an interlayer insulation film 117 comprising BPSG (Boron-Phospho Silicate Glass) and TEOS (Tetra Ethyl Ortho Silicate) is deposited over the entire surface and reflow of this interlayer insulation film 117 is carried out. This reflow is carried out at a temperature of 800° C. in the atmosphere of $N_2$ for 20 minutes. Then, the interlayer insulation film 117 is planarized by a CMP (Chemical Mechanical Polishing) method or the like. The foregoing steps are MOSFET forming steps in generally known DRAM manufacturing technology.

Subsequently, as shown in FIG. 25, the interlayer insulation film 117 is patterned so that contact holes 118 for establishing contact with source/drain regions of cell transistors provided on the semiconductor substrate 111, namely, with the diffusion layer 115 in the memory cell array part 101, are formed in the interlayer insulation film 117. This patterning can be performed by SAC (Self Align Contact) etching since etching selectivity between the interlayer insulation film 117 and the sidewalls 116 is high.

Next, as shown in FIG. 26, a polycrystalline Si film is buried in each of the contact holes 118, and this polycrystalline Si film is polished by CMP until the interlayer insulation film 117 is exposed so that conductive plugs 119 are formed. Next, an HTO film (High Temperature Oxide film) is deposited over the entire surface as an interlayer insulation film 120.

Thereafter, a photoresist (not shown) is formed over the entire surface. Openings are formed at respective portions of this photoresist corresponding to bit contact portions of the memory cell array part 101, source/drain contact portions of MOSFETs in the peripheral circuit part 102, and gate portions of the MOSFETs in the peripheral circuit part 102. At the same time, openings are formed at a portion thereof corresponding to a ring-shaped diffusion layer 115 in the guard ring part 104. Then, using this photoresist as a mask, the interlayer insulation films 120 and 117 are etched. Consequently, as shown in FIG. 26, contact holes 121 to 123 are formed, and a ring-shaped trench 147 reaching the diffusion layer 115 is also formed in the guard ring part 104. The contact holes 121 are formed at the bit contact portions in the memory cell array part 101, the contact holes 122 are formed at the source/drain contact portions of the MOSFETs in the peripheral circuit part 102, and the contact holes 123 are formed in the gate portions of the MOSFETs in the peripheral circuit part 102. Incidentally, the contact holes 122 are also formed at other portions, though not shown, requiring substrate contact, such as diffusion layer resistances and so on in the peripheral circuit part 102.

Subsequently, as shown in FIG. 27, the source/drain portions and the portions requiring the substrate contact such as the diffusion layer resistances inside the peripheral circuit part 102 undergo ion implantation for contact stabilization in the peripheral circuit part 102 between the semiconductor substrate 111 (diffusion layer 115) and wiring layers to be formed thereafter comprising refractory metal. Then, in order to activate implanted impurities, furnace annealing or RTA (Rapid Thermal Annealing) such as ramp annealing is conducted. The temperature of this high-temperature annealing is set to about 1000° C.

Next, a barrier metal film 124 constituted of a layer of a Ti film and a TiN film, a W wiring layer 125, and a SiON film 126 as an antireflection film are deposited, Thereafter, a photoresist (not shown) is formed and openings are formed in this photoresist. Subsequently, using this photoresist film as a mask, the wiring layer 125 is etched. Incidentally, in some cases, the SiON film 126 is not formed. Next, as shown in FIG. 27, a pressure-reduced SiN film 127 is deposited by a pressure-reduced CVD method, and the wiring layer 125 is covered with the pressure-reduced SiN film 127.

Thereafter, as shown in FIG. 28, a high-density plasma oxide film (HDP film) is deposited over the entire surface as an interlayer insulation film 128, and the interlayer insulation film 128 is planarized by a planarization technique such as CMP.

Subsequently, a SiN film 129 is deposited. Next, storage-side holes 130 of the cells are formed by a generally known contact forming method through PSC (Poly Shrunk Contact), and contact plugs 131 are buried in these storage-side holes 130.

Next, cylindrical storage electrodes 132 are formed on the interlayer insulation film 128 by a generally known cylinder forming method. Subsequently, after a SiN film and an oxide film to be a capacitor dielectric film 133 are formed by a CVD method, opposing electrodes 134 comprising doped amorphous Si are formed.

Then, as shown in FIG. 28, an insulation film such as an HDP film is deposited as an interlayer insulation film 135 after capacitors are formed. Thereafter, this interlayer insulation film 135 is planarized using a planarization technique such as CMP.

Next, as shown in FIG. 29, contact holes 136 reaching a part of the wiring layers 125 are formed in the peripheral circuit part 102 while, in the guard ring part 104, a ring-shaped trench 137 reaching the wiring layer 125 is formed. This means that the contact holes 136 and the trench 137 are formed concurrently. At this time, contact holes, though not shown, reaching a part of the wiring layers 114 or wiring layers (not shown) positioned above the wiring layers 114 are concurrently formed as well. Next, barrier metal films 138 are formed in the contact holes 136 and the trench 137, and further, contact plugs 139 are buried therein.

Thereafter, as shown in FIG. 30, while an interlayer insulation film 142, contact holes 143, and so on are being formed, multiple layers of upper wiring layers 140, contact plugs 144, and barrier metal films 141 thereof are formed. Then, an HDP film and a SiN film (not shown) to be a cover film are deposited to complete the DRAM (semiconductor device).

In such a DRAM manufacturing method, however, the interlayer insulation film 117 suffers heat shrinkage at the time of the annealing after the contact holes 121 to 123 are formed, the heat shrinkage starting from the trench 147 in the guard ring (moisture resistant ring) part 104 provided so as to surround the memory cell array part 101 and the peripheral circuit part 102, as shown in FIG. 31. This heat shrinkage causes the deformation of the contact holes 121 to 123 near the trench 147. The amount of this deformation is larger as a contact hole is deeper. Therefore, the contact holes 122 reaching the semiconductor substrate 111 have the largest deformation amount. The occurrence of such contact hole deformation is liable to cause connection failure in the deformed contact holes. If the distances between the trench 147 and all the contact holes 121 to 123 were set to unconditionally large values, the deformation of the contact holes 121 to 123 might be prevented, but this would hinder scale-down of the semiconductor device.

Even if high-temperature annealing is sufficiently applied, for example, at 1000° C. for five seconds before the contact holes 121 to 123 are formed, the interlayer insulation film 117 similarly suffers heat shrinkage when it undergoes another heat treatment after these contact holes are formed.

Accordingly, with the intention of solving such a disadvantage, a semiconductor device in which a guard ring is provided not only on a boundary between a peripheral circuit part and a dicing line part but also on an inner side thereof is disclosed in Japanese Patent Application Laid-open No. 2002-134506. This patent application also discloses that a plurality of guard rings are discontinuously provided. This patent application describes that the above structure enables reduction in a heat shrinkage amount of an interlayer insulation film to improve reliability.

Nevertheless, the contact hole deformation cannot be prevented by the invention described in the Japanese Patent Application Laid-open No. 2002-134506 mentioned above, either. This is because of the following reasons.

Firstly, even if not only the guard ring is provided on the boundary between the peripheral circuit part and the dicing line part, but also the second guard ring is formed on the inner side thereof as a buffer layer with the intention of preventing shrinkage, the same phenomenon as in the case of the first guard ring disposed on the boundary may possibly occur depending on the arrangement of the second guard ring. Namely, the contact hole deformation is caused due to the occurrence of heat shrinkage starting from the second guard ring.

Secondly, as for the divided guard ring, the shrinkage of the interlayer insulation film cannot be prevented even when simply divided portions of the guard ring are arranged.

When the guard ring having such a complicate structure as described in the Japanese Patent Application Laid-open No. 2002-134506 is provided, a problem of the increase in chip area is posed. Specifically, when the guard ring structure is made more complicated than that used before, an additional region for forming the guard ring needs to be provided. This results in restriction on large-scale integration and a lower degree of design (process) freedom.

SUMMARY OF THE INVENTION

The present invention is made in light of the above problem. It is an object of the present invention to provide a semiconductor device and a manufacturing method thereof which enable the prevention of deformation of contact holes formed in an interlayer insulation film to realize stable contact.

As a result of assiduous studies, the inventor of the present application has found out that, in the prior manufacturing method, since the guard ring trench divides the interlayer insulation film over a wide range and high-temperature annealing is carried out in this state, the interlayer insulation film greatly suffers heat shrinkage to cause contact hole deformation. Such a phenomenon similarly occurs when the plural guard rings are provided. The inventor of this application has also found out that, in the prior manufacturing method, the contact hole deformation is caused in the case of forming the plural guard rings since the length thereof is not taken into consideration. As a result of the assiduous studies of the inventor of this application, the deformation amount of a contact hole is the largest at a division part (guard ring), and gradually decreases as the distance from this part gets longer. The inventor of this application has also found out that appropriate adjustment of the temperature of heat treatment alleviates the heat shrinkage of the interlayer insulation film so that the contact hole deformation can be alleviated. This means that the deformation amount of a contact hole also depends on the process temperature after it is formed.

The inventor of this application has come up with various forms of the invention as described below based on these findings.

A first manufacturing method of a semiconductor device according to the present invention aims at a manufacturing method of a semiconductor device including a semiconductor substrate, an integrated circuit part formed on the semiconductor substrate, and a guard ring part formed on the semiconductor substrate and surrounding the integrated circuit part to prevent moisture intrusion from the outside.

According to this manufacturing method, first in the integrated circuit part, a gate insulation film and a gate electrode are formed on the semiconductor substrate, and a pair of impurity diffusion layers are formed in a surface of the semiconductor substrate to sandwich the gate electrode in a plan view. Next, a first interlayer insulation film covering at least the gate electrode and the pair of impurity diffusion layers is formed to extend over the integrated circuit part and the guard ring part, and contact holes reaching at least the pair of impurity diffusion layers are formed in the first interlayer insulation film. Thereafter, a wiring layer connected to at least the pair of impurity diffusion layers via the contact holes is formed on the first interlayer insulation film, and a second interlayer insulation film covering the wiring layer is formed on the first interlayer insulation film. Subsequently, a trench reaching the semiconductor substrate is formed in the first and second interlayer insulation films in the guard ring part, and a buried conductive layer is buried in the trench.

A second manufacturing method of a semiconductor device according to the present invention aims at a manufacturing method of a semiconductor device including a semiconductor substrate, an integrated circuit part formed on the semiconductor substrate, and a guard ring part formed on the semiconductor substrate and surrounding the integrated circuit part to prevent moisture intrusion from the outside.

According to this manufacturing method, an interlayer insulation film is first formed on or above the semiconductor substrate to extend over the integrated circuit part and the guard ring part, and contact holes are formed in the interlayer insulation film in the integrated circuit part. Next, a wiring layer is buried in each of the contact holes, and a trench is subsequently formed in the interlayer insulation film in the guard ring part. Thereafter, a buried conductive layer is buried in the trench.

According to these first and second manufacturing methods of the semiconductor device, when the contact holes are formed, the trench is not formed in the interlayer insulation film which may possibly suffer heat shrinkage, in the guard ring part, and in this state, the wiring layer is formed. The trench is formed in the guard ring part after that, or after the second interlayer insulation film is further formed. Consequently, there exists no portion to be a starting point of the heat shrinkage at the time of high-temperature annealing so that contact hole deformation is not caused.

A third manufacturing method of a semiconductor device according to the present invention aims at a manufacturing method of a semiconductor device including a semiconductor substrate, an integrated circuit part formed on the semiconductor substrate, and a guard ring part formed on the semiconductor substrate and surrounding the integrated circuit part to prevent moisture intrusion from the outside. According to this manufacturing method, first in the integrated circuit part, a gate insulation film and a gate electrode are formed on the semiconductor substrate, and a pair of impurity diffusion layers are formed in a surface of the semiconductor substrate to sandwich the gate electrode in a plan view. Next, a first interlayer insulation film covering at least the gate electrode and the pair of impurity diffusion layers is formed to extend over the integrated circuit part and the guard ring part, and contact holes reaching at least the pair of impurity diffusion layers and a plurality of first trenches reaching the semiconductor substrate in the guard ring part are formed in the first interlayer insulation film. Thereafter, a wiring layer connected to at least the pair of impurity diffusion layers via the contact holes is formed on the first interlayer insulation film, and a first buried conductive layer is buried in each of the first trenches. Note that, according to this manufacturing method, in the step of forming the plural first trenches, the plural first trenches are formed discontinuously, and each of the plural first trenches is formed to be shorter as the distance thereof to a contact hole among the contact holes which is positioned nearest to the first trench itself is shorter.

According to this third manufacturing method, appropriate adjustment of the length of each of the trenches formed in the guard ring part enables the prevention of contact hole deformation.

A fourth manufacturing method of a semiconductor device according to the present invention aims at a manufacturing method of a semiconductor device including a semiconductor substrate, an integrated circuit part formed on the semiconductor substrate, and a guard ring part formed on the semiconductor substrate and surrounding the integrated circuit part to prevent moisture intrusion from the outside. According to this manufacturing method, first in the integrated circuit part, a gate insulation film and a gate electrode are formed on the semiconductor substrate, and a pair of impurity diffusion layers are formed in a surface of the semiconductor substrate to sandwich the gate electrode in a plan view. Next, a first interlayer insulation film covering at least the gate electrode and the pair of impurity diffusion layers are formed to extend over the integrated circuit part and the guard ring part, and contact holes reaching at least the pair of impurity diffusion layers and a first trench reaching the semiconductor substrate in the guard ring part are formed in the first interlayer insulation film. Thereafter, a wiring layer connected to at least the pair of the impurity diffusion layers via the contact holes are formed on the first interlayer insulation film, and a first buried conductive layer is buried in the first trench. Note that the temperature of the semiconductor substrate is set to 800° C. or lower during the period from the step of forming the contact holes and the first trench to the step of forming the wiring layer and burying the first buried conductive layer.

According to this fourth manufacturing method, appropriate adjustment of the temperature of heat treatment while the contact holes are in an opened state enables the prevention of contact hole deformation.

DETAILED DESCRIPTION OF THE PREFERRED EMBODIMENTS

Figure 1:
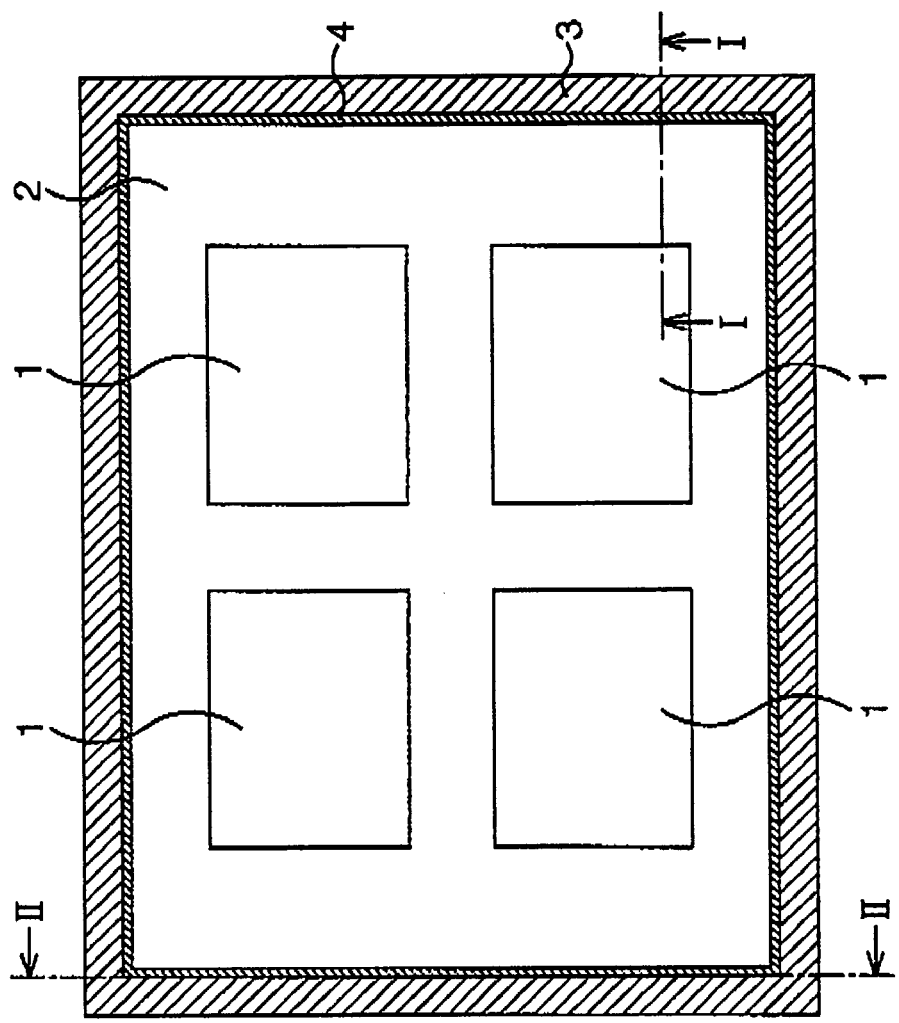
FIG. 1 is a schematic plan view showing the structure of a semiconductor device according to an embodiment of the present invention.

Concrete explanation of a semiconductor device and a manufacturing method thereof according to embodiments of the present invention will be given with reference to the attached drawings. FIG. 1 is a schematic plan view showing the structure of a semiconductor device according to an embodiment of the present invention.

First Embodiment

The first embodiment of the present invention will be first explained. A DRAM (semiconductor device) according to this embodiment is roughly defined into a memory cell array part 1 having a memory cell array provided therein, a peripheral circuit part 2 having drive circuits of memory cells and so on, and a dicing line part 3 on an outer periphery of a chip. Between the peripheral circuit part 2 and the dicing line part 3, a guard ring part (moisture resistant ring part) 4 is provided. The memory cell array part 1 and the peripheral circuit part 2 constitute an integrated circuit part.

Figure 2:
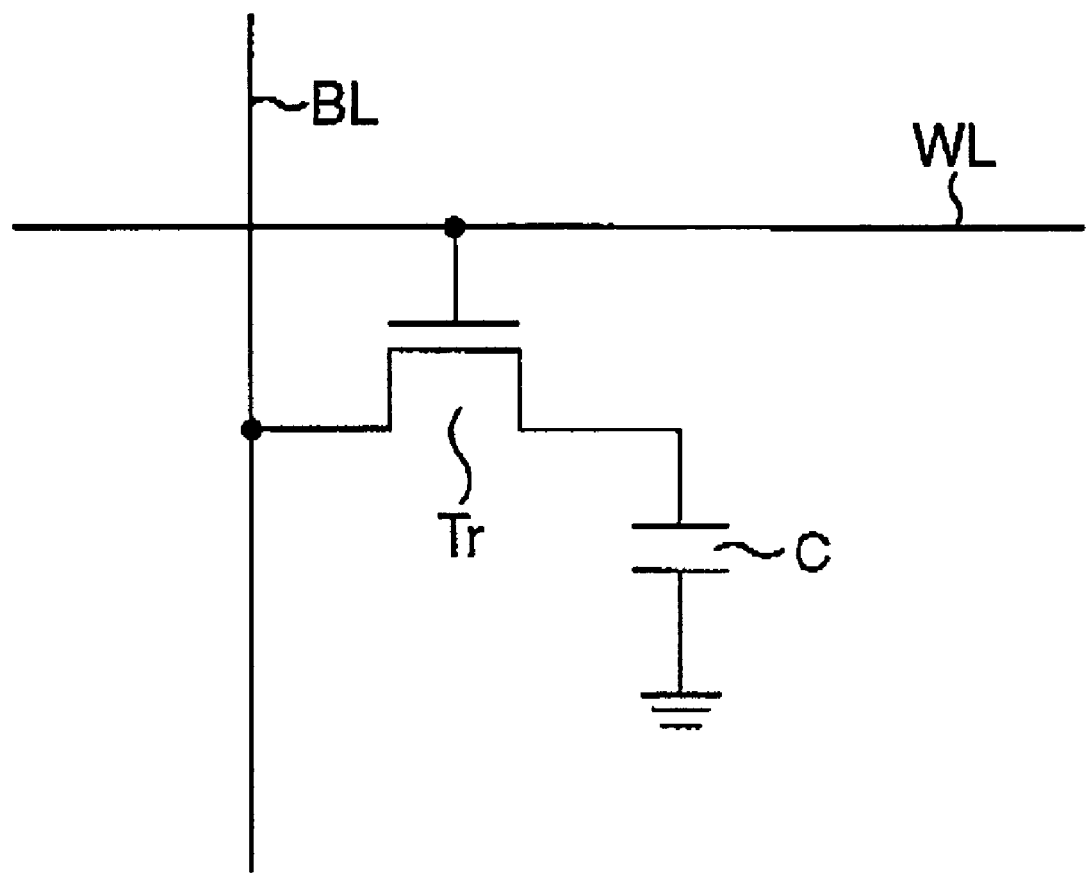
FIG. 2 is a circuit diagram showing the structure of a memory cell provided in an array part 1.

FIG. 2 is a circuit diagram showing the structure of a memory cell provided in the array part 1. Each memory cell has a capacitor C and a MOS transistor Tr. A gate of the MOS transistor Tr is connected to a word line WL. A source/drain thereof is connected to a bit line BL while the other source/drain is connected to a storage electrode of the capacitor C. An opposing electrode of the capacitor C is supplied with a fixed potential, for example, the ground potential. Note that each word line WL is shared by the plural MOS transistors Tr arranged in a direction along an extending direction of the word line WL. Similarly, each bit line BL is shared by the plural MOS transistors Tr arranged in a direction along an extending direction of the bit line BL.

Next, a sectional structure of the semiconductor device as described above will be explained. Note that the sectional structure of the semiconductor device will be explained along with a manufacturing method thereof for convenience' sake. FIG. 3 to FIG. 7 are sectional views showing a manufacturing method of the semiconductor device according to the first embodiment of the present invention in the order of its steps. Note that FIG. 3 to FIG. 7 are sectional views taken along I—I line in FIG. 1. FIG. 8 is a sectional view taken along II—II line in FIG. 1.

Figure 3:
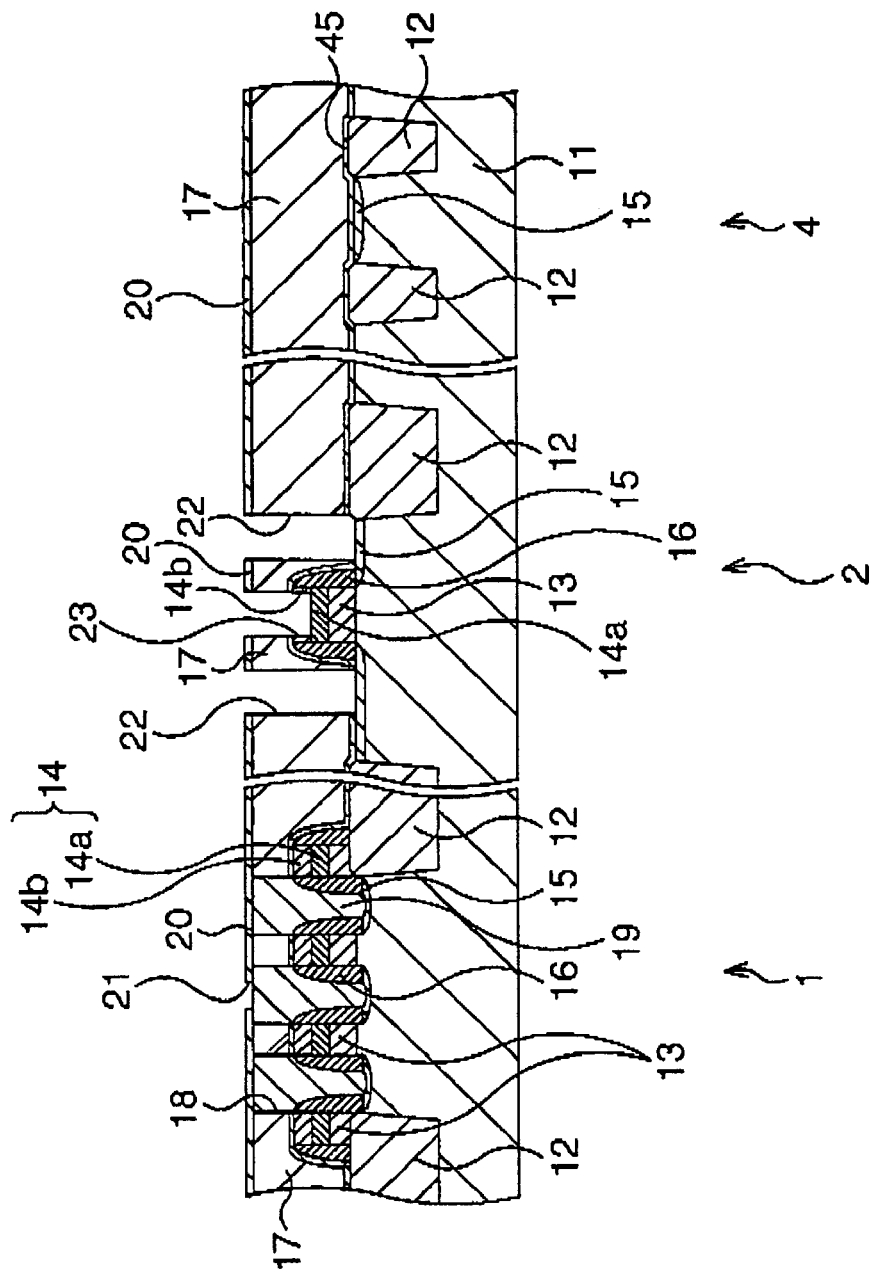
FIG. 3 is a sectional view showing a manufacturing method of a semiconductor device according to a first embodiment of the present invention.

First, as shown in FIG. 3, element isolation regions 12 are formed on a surface of a semiconductor substrate 11 such as a silicon substrate through a generally known STI (Shallow Trench Isolation) process. Thereafter, ion implantation is conducted to form wells, a channel stop diffusion layer (neither is shown), and so on. Next, a gate oxide film 13 is formed. Thereafter, a polycrystalline Si film and a WSi film are deposited in sequence, over which a SiN film and so on as an insulation film layer are further deposited. Next, formation of a resist film, patterning of the resist film, and etching are conducted so that wiring layers 14 each constituted of a polycrystalline Si film 14a and a WSi film 14b, and a SiN film 45 are formed.

Next, ion implantation for forming an LDD (Lightly Doped Drain) is conducted to form diffusion layers 15. Next, sidewalls 16 comprising, for example, $Si_3N_4$ are formed. Thereafter, an interlayer insulation film 17 comprising BPSG (Boron-Phospho Silicate Glass) or TEOS (Tetra Ethyl Ortho Silicate) with a film thickness of, for example, about 1 μm is deposited over the entire surface, and reflow of this interlayer insulation film 17 is carried out. This reflow is carried out under the conditions of, for example, the temperature of 800° C., the atmosphere of $N_2$, and the duration of 20 minutes. Then, the interlayer insulation film 17 is planarized by a method such as CMP (Chemical Mechanical Polishing). The foregoing steps are MOSFET forming steps in generally known DRAM manufacturing technology.

Subsequently, the interlayer insulation film 17 is patterned so that contact holes 18 for establishing contact with source/drain regions of cell transistors provided on the semiconductor substrate 11, namely, with the diffusion layers 15 in the memory cell array part 1 are formed in the interlayer insulation film 17. This patterning can be carried out by, for example, SAC (Self Align Contact) etching since etching selectivity between the interlayer insulation film 17 and the sidewalls 16 is high.

Next, a polycrystalline Si film is buried in the contact holes 18 and this polycrystalline Si film is polished by CMP until the interlayer insulation film 17 is exposed so that conductive plugs 19 are formed. Next, an HTO film (High Temperature Oxide film) with a film thickness of, for example, about 100 nm is deposited over the entire surface as an interlayer insulation film 20. Incidentally, as this interlayer insulation film 20, a Si-rich oxide film (SRO film) or a TEOS (Tetra Ethyl Ortho Silicate) film, for example, may be formed.

Thereafter, a photoresist (not shown) is formed over the entire surface. Openings are formed at respective portions of this photoresist corresponding to bit contact portions of the memory cell array part 1, source/drain contact portions of MOSFETs in the peripheral circuit part 2, and gate portions in the MOSFETs in the peripheral circuit part 2. At this time, openings are also formed, though not shown, at other portions requiring substrate contact, such as diffusion layer resistances in the peripheral circuit part 2. Incidentally, in some cases, the openings are not formed at the portions corresponding to the gate portions of the MOSFETs, as will be described later. Then, using this photoresist as a mask, the interlayer insulation films 20 and 17 are etched to form contact holes 21 to 23. The contact holes 21 are formed at the bit contact portions in the memory cell array part 1, the contact holes 22 are formed at the source/drain contact portions of the MOSFETs in the peripheral circuit part 2, and the contact holes 23 are formed at the gate portions of the MOSFETs in the peripheral circuit part 2. Incidentally, the contact holes 22 are also formed at other portions, though not shown, requiring substrate contact, such as the diffusion layer resistances in the peripheral circuit part 2. At this time, as shown in FIG. 3, a trench is not formed in the guard ring part 4 in this embodiment unlike the prior art method.

Subsequently, ion implantation for contact compensation is carried out for source/drain portions and the portions requiring the substrate contact such as the diffusion layer resistances inside the peripheral circuit part 2, in order to stabilize contact in the peripheral circuit part 2 between the semiconductor substrate 11 (diffusion layer 15) and wiring layers to be formed thereafter. In this ion implantation, for example, phosphorus and boron are implanted into active regions on n-type sides and into active regions on p-type sides respectively, using resist masks.

Then, after the resist mask is removed, RTA (Rapid Thermal Annealing) such as ramp annealing is conducted in order to activate the implanted impurities. This RTA is conducted, for example, at a temperature of 1000° C. for five seconds. This series of processes from the ion implantation to the annealing lowers a contact resistance.

Figure 4:
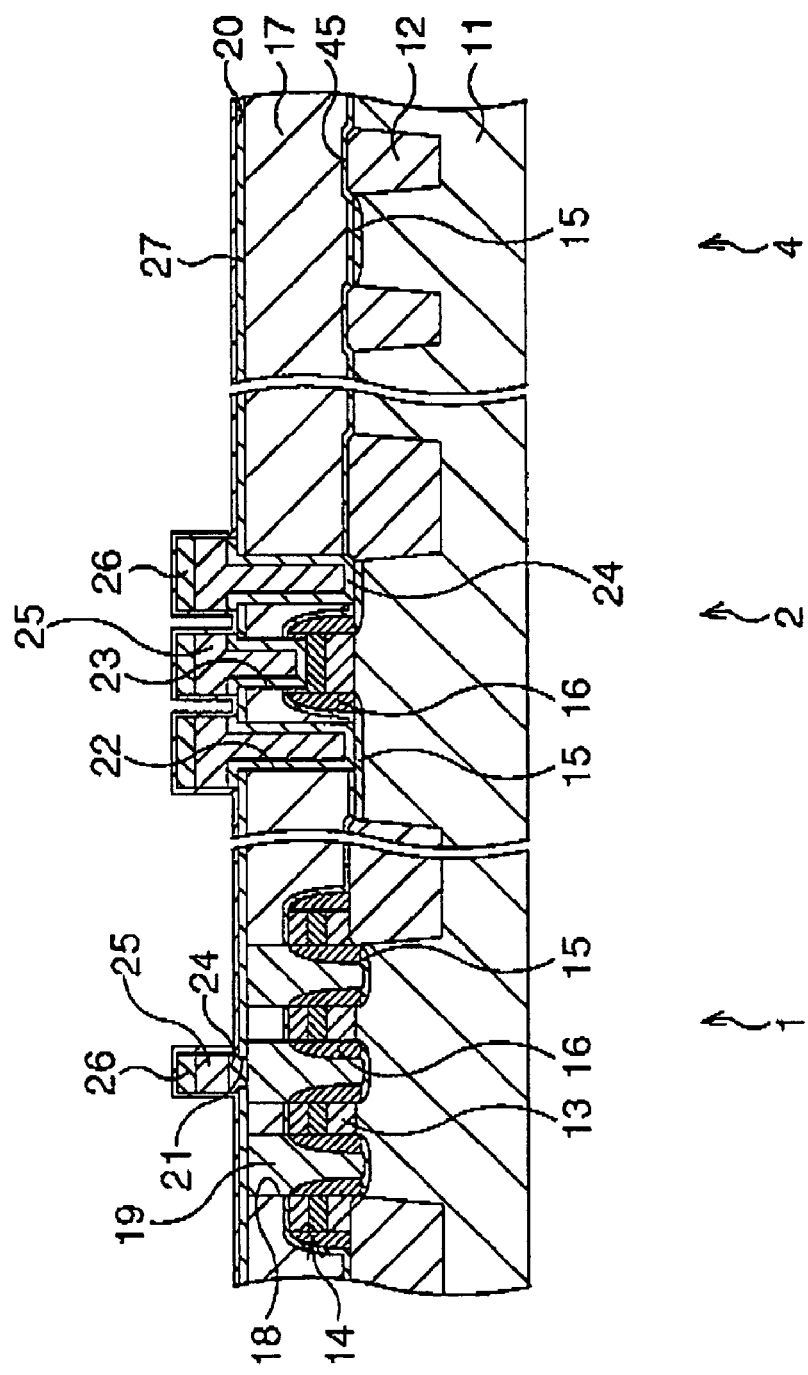
FIG. 4, which is similarly a view showing the manufacturing method of the semiconductor device according to the first embodiment of the present invention, is a sectional view showing a subsequent step to the step shown in FIG. 3.

Next, as shown in FIG. 4, a barrier metal film 24 constituted of a layer of a Ti film and a TiN film, a W wiring layer 25, and a SiON film 26 as an antireflection film are deposited. Thereafter, a photoresist (not shown) is formed and openings are formed in this photoresist. Subsequently, using this photoresist film as a mask, the wiring layer 25 is etched. Incidentally, in Some cases, the SiON film 26 need not be formed. Next, a pressure-reduced SiN film 27 with a film thickness of, for example, 10 nm to 20 nm is deposited by a pressure-reduced CVD method, and the wiring layer 25 is covered with the pressure-reduced SiN film 27.

At this time, a generally known sidewall forming technique may be used, forming a SiN film along sidewalls of the wiring layers 25 as a spacer.

Figure 5:
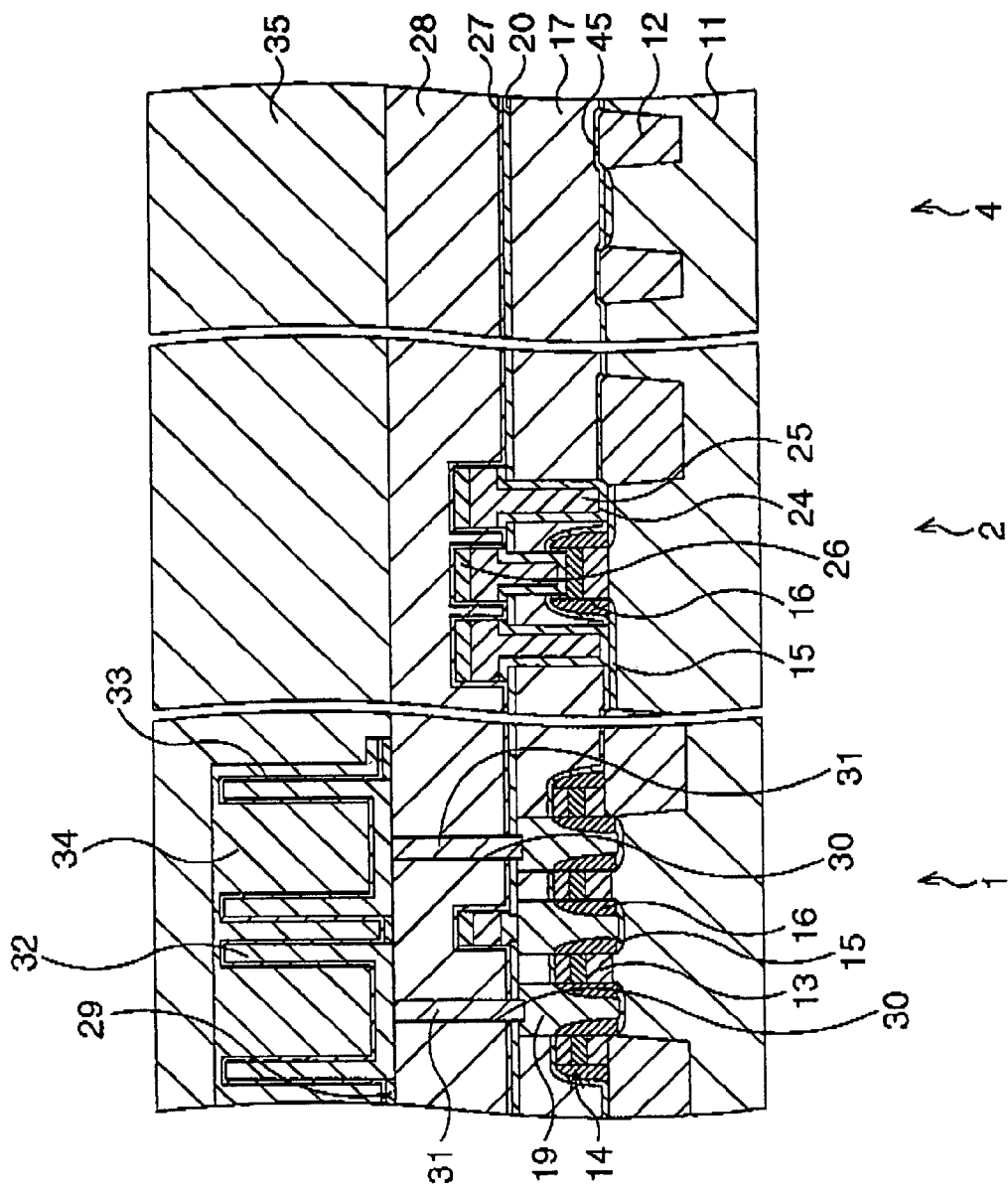
FIG. 5, which is similarly a view showing the manufacturing method of the semiconductor device according to the first embodiment of the present invention, is a sectional view showing a subsequent step to the step shown in FIG. 4.

Thereafter, as shown in FIG. 5, a high-density plasma oxide film (HDP film) with a film thickness of, for example, about 1.0 µm is deposited over the entire surface as an interlayer insulation film 28, and the interlayer insulation film 28 is planarized by a planarization technique such as CMP.

Subsequently, a SiN film 29 having a film thickness of, for example, about 350 nm and formed by plasma processing is deposited. Next, storage-side holes 30 of the cells are formed by a generally known contact forming method through PSC (Poly Shrunk Contact), and contact plugs 31 are buried in these storage-side holes 30.

Next, cylindrical storage electrodes 32 are formed over the interlayer insulation film 28 by a generally known cylinder forming method, Subsequently, after a SiN film and an oxide film to be a capacitor dielectric film 33 are formed by a CVD method, opposing electrodes 34 comprising doped amorphous Si are formed. Through these steps, capacitors are formed. In forming the capacitor dielectric film 33, for example, the SiN film is formed at 650° C. and the oxide film is formed at 680° C. The thickness of the opposing electrodes 34 is, for example, about 10 nm.

Then, as shown in FIG. 5, an insulation film such as an HDP film is deposited as an interlayer insulation film 35 after the capacitors are formed. Thereafter, this interlayer insulation film 35 is planarized using a planarization technique such as CMP.

Figure 6:
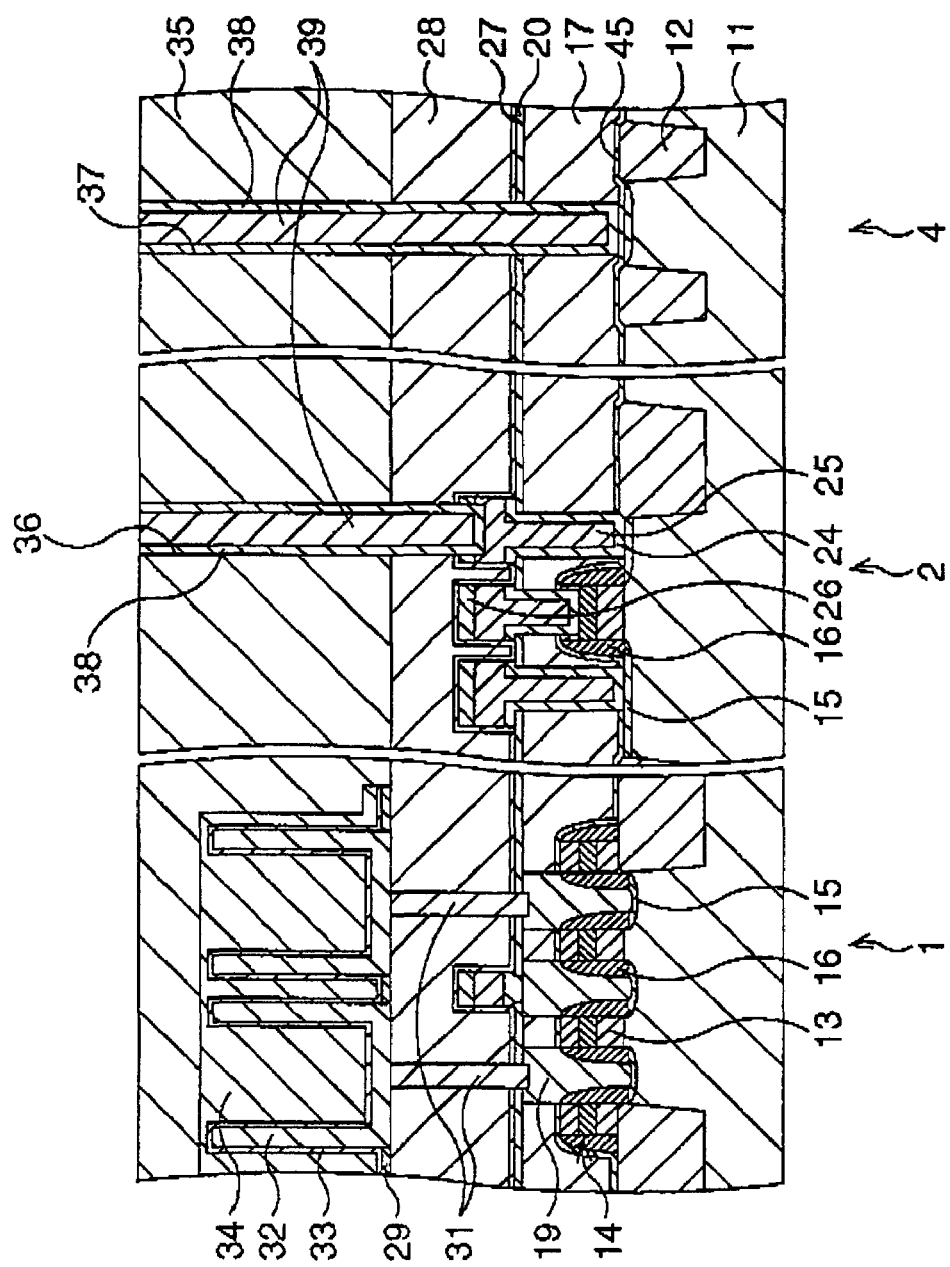
FIG. 6, which is similarly a view showing the manufacturing method of the semiconductor device according to the first embodiment of the present invention, is a sectional view showing a subsequent step to the step shown in FIG. 5.

Next, as shown in FIG. 6, contact holes 36 reaching a part of the wiring layers 25 are formed in the peripheral circuit part 2 while, in the guard ring part 4, a trench 37 reaching the diffusion layer 15 is formed. This means that the contact holes 36 and the trench 37 are formed concurrently. At this time, contact holes, though not shown, reaching a part of the wiring layers 14 or wiring layers (not shown) positioned above the wiring layers 14 may be concurrently formed, but contact holes reaching the diffusion layers 15 or the semiconductor substrate 11 are not formed in the memory cell array part 1 and the peripheral circuit part 2. Next, barrier metal films 38 are formed in the contact holes 36 and the trench 37, and contact plugs 39 each comprising, for example, a W film are further buried therein.

At this time, the contact plugs 39 buried in the contact holes 36 are not used as the substrate contact in the memory cell array part 1 and the peripheral circuit part 2, and are used as contact with conductive layers positioned in layers upper than the wiring layers 14.

In the peripheral circuit part 2, a low contact resistance is required for the diffusion layer 15. However, it is not easy to form contact plugs in contact holes so long as to pass through the interlayer insulation films 35, 28, 27, and 17 to connect the W film and the silicon substrate with a low resistance. Therefore, this embodiment does not adopt such a structure that upper wirings formed over the interlayer insulation film 35 and the semiconductor substrate are directly connected to each other, but adopts such a structure that they are indirectly connected via the wiring layers 25 or 14.

Meanwhile, in the guard ring part, it is not necessary to take the contact resistance into consideration. It is only necessary that layers formed in the same layer as the upper wirings are simply physically connected to the silicon substrate. Accordingly, the guard ring can be easily formed only by adjusting etching time.

Figure 7:
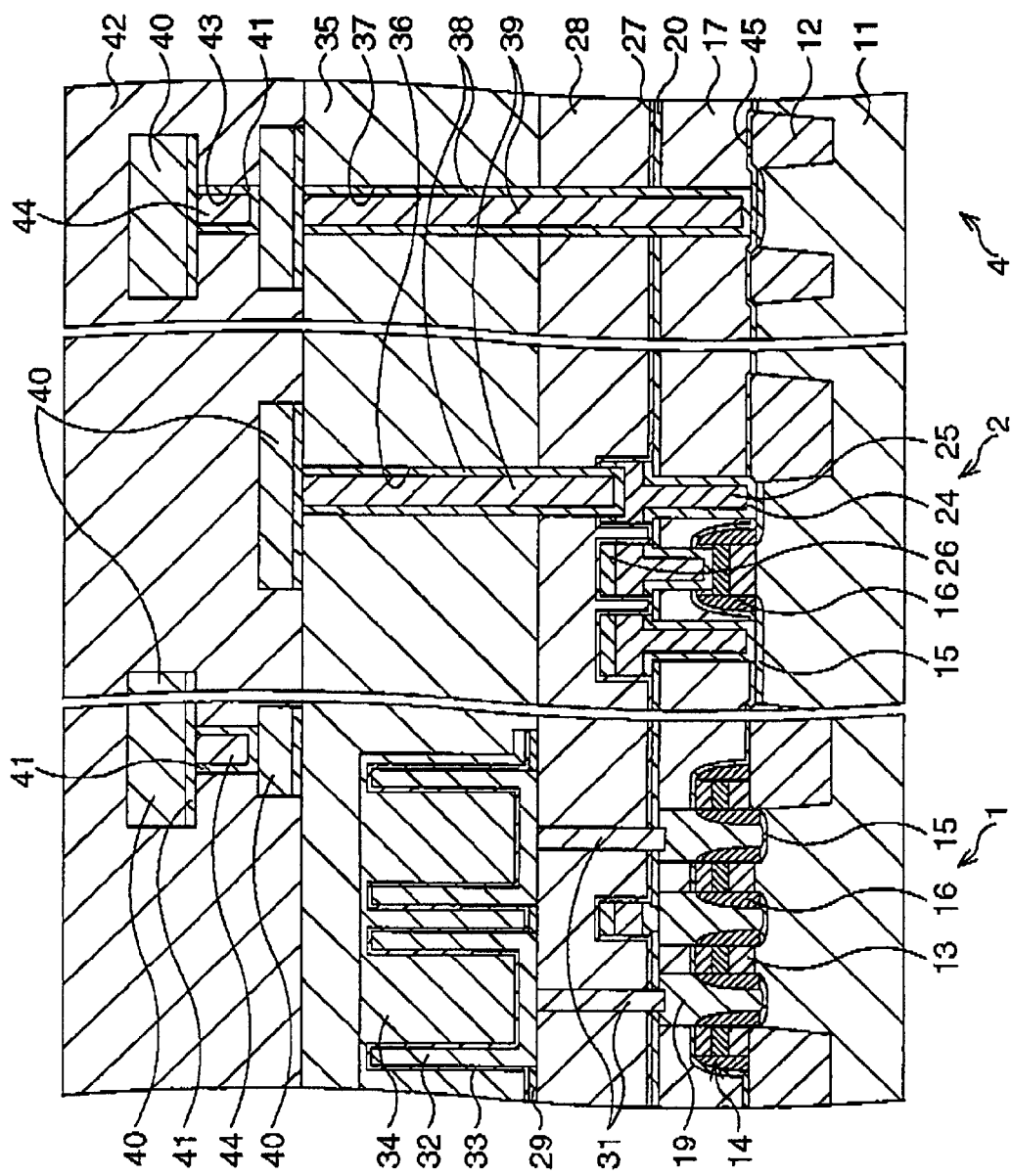
FIG. 7, which is similarly a view showing the manufacturing method of the semiconductor device according to the first embodiment of the present invention, is a sectional view showing a subsequent step to the step shown in FIG. 6.
Figure 8:
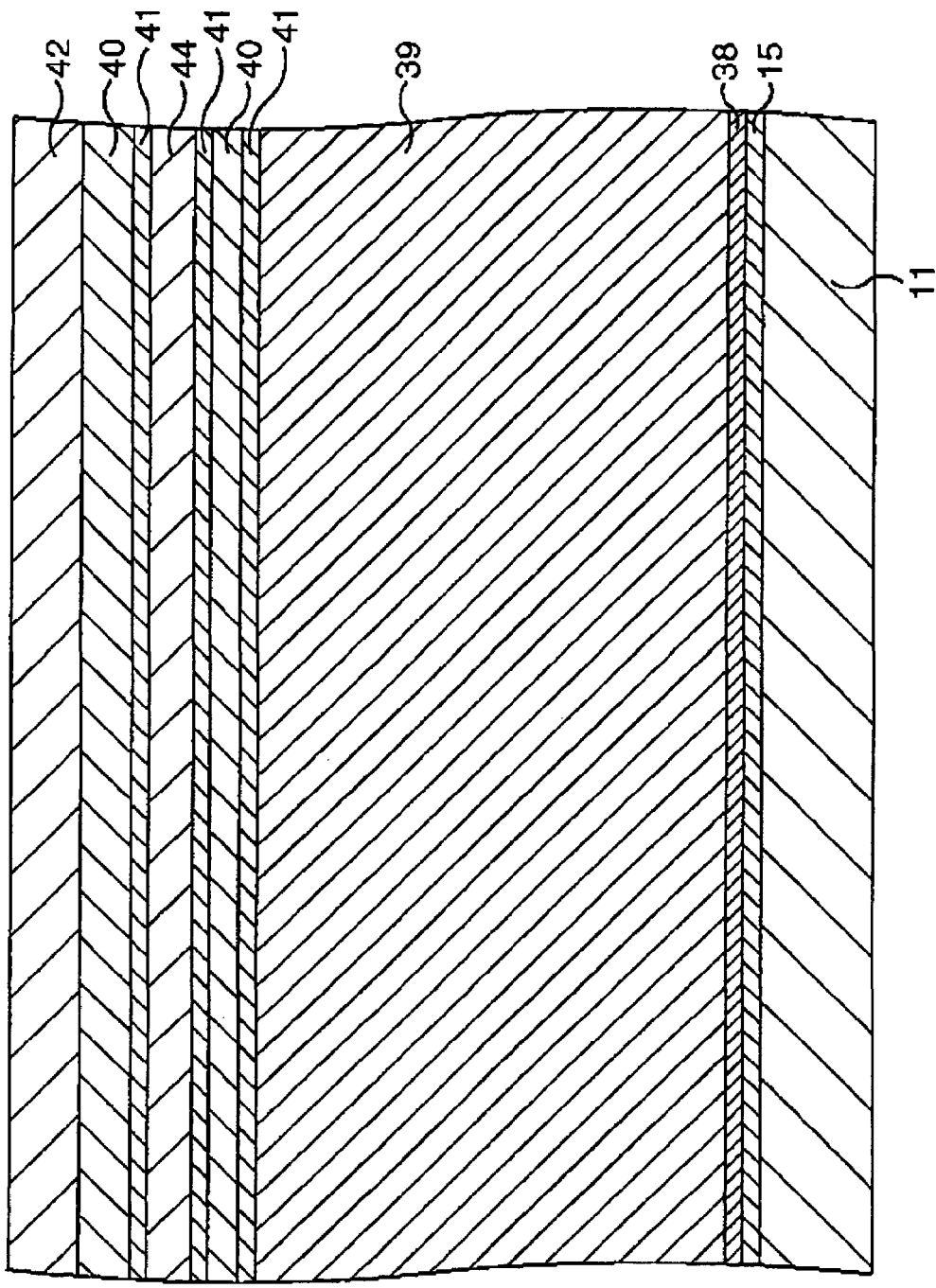
FIG. 8 is a sectional view taken along II—II line in FIG. 1.

As shown in FIG. 7, after the contact plugs 39 are formed, multiple layers of upper wiring layers 40, contact plugs 44, and barrier metal films 41 thereof are formed while an interlayer insulation film 42, contact holes 43, and so on are formed. Then, an HDP film and a SiN film (neither is shown) to be a cover film (moisture resistant protective film) are deposited. This SiN film is formed by, for example, plasma processing. Thereafter, openings for pad contact and fuse windows are opened in the cover film to complete the semiconductor device.

As described above, in the prior art method, after the contact holes 121 to 123 in the peripheral circuit part 102, and the trench 147 for the guard ring are formed in the interlayer insulation film 117, furnace annealing (FA) or high-temperature annealing such as RTA is conducted in order to lower a contact resistance in the peripheral circuit part 102, while neither the contact holes 121 to 123 nor the trench 147 is in the state of having buried materials therein. Consequently, the interlayer insulation film 117 is divided into two regions by the ring-shaped trench 147 over a wide range at the time of this high-temperature annealing. Accordingly, the high-temperature annealing causes heat shrinkage of the interlayer insulation film 117 with the trench 147 as a starting point so that the contact holes 121 to 123 formed near this trench 147 are deformed.

In this embodiment, on the other hand, a trench is not formed in the guard ring part 4 when the contact holes 22 and 23 are formed in the peripheral circuit part 2. In this state, RTA for lowering the contact resistance is conducted. The trench 37 in the guard ring part 4 is formed after the wiring layers 25 are buried in the contact holes 22 and 23 and the interlayer insulation film 35 is further formed. This prevents heat shrinkage of the interlayer insulation film 17 with the trench as a starting point, which was caused in the prior art, at the time of the heat treatment for lowering the contact resistance in the peripheral circuit part 2. Therefore, even when the contact holes 22 and 23 are formed in positions near the guard ring part 4, the deformation of these contact holes 22 and 23 is not caused. As a result, shrink in chip size and high density design of chips are made possible while securing good contact since no deformation of contact holes occurs even when the contact holes are formed in the vicinity of the guard ring part 4 in order to reduce a chip area.

Incidentally, a trench pattern such as an alignment mark may be formed in the interlayer insulation film 17 in the dicing line part 3 concurrently with the contact holes 22 and 23. In this case, however, heat shrinkage may possibly occur in the interlayer insulation film 17 since this trench pattern acts similarly to the trench 147 for the guard ring in the prior art. Therefore, it is preferable to be careful about the following points.

Figure 9:
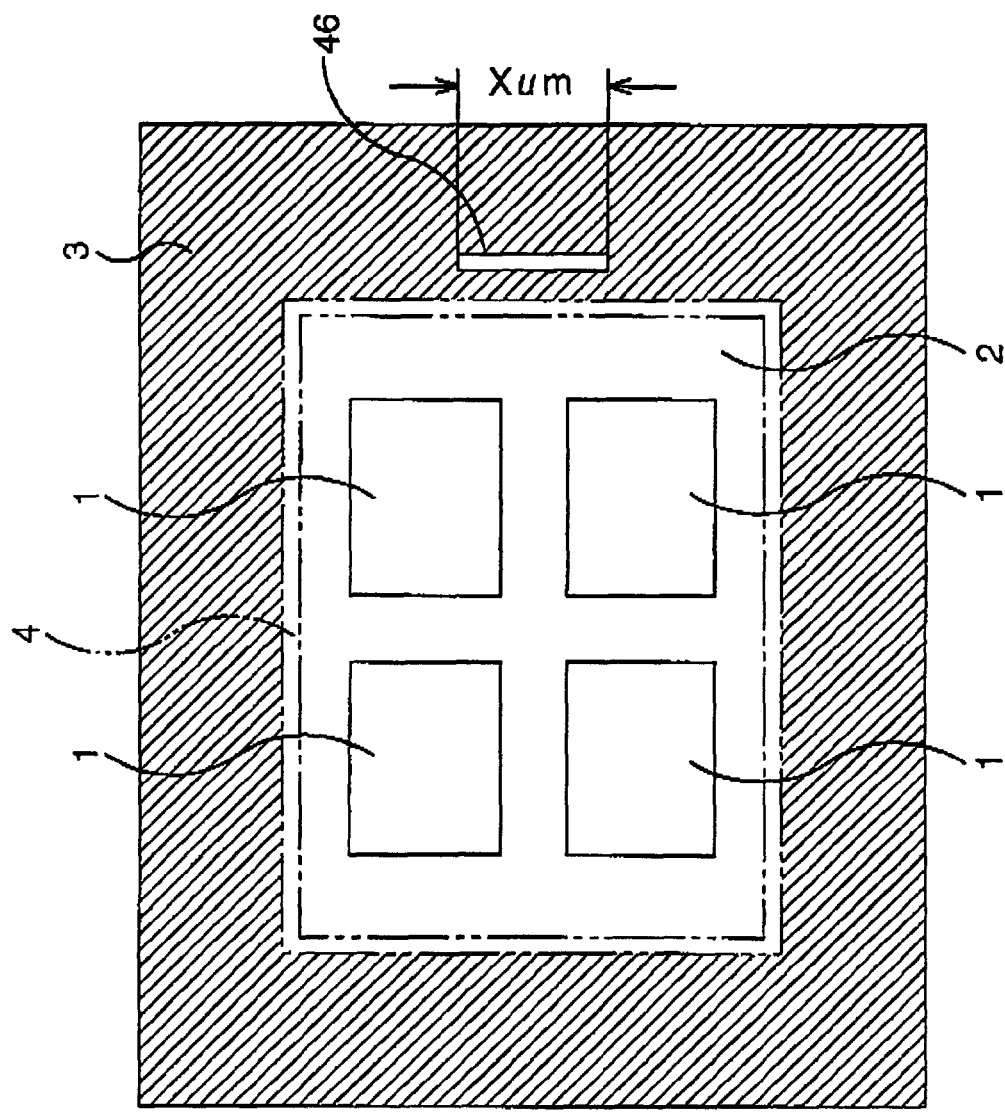
FIG. 9 is a schematic view showing the position of a trench pattern.
Figure 10:
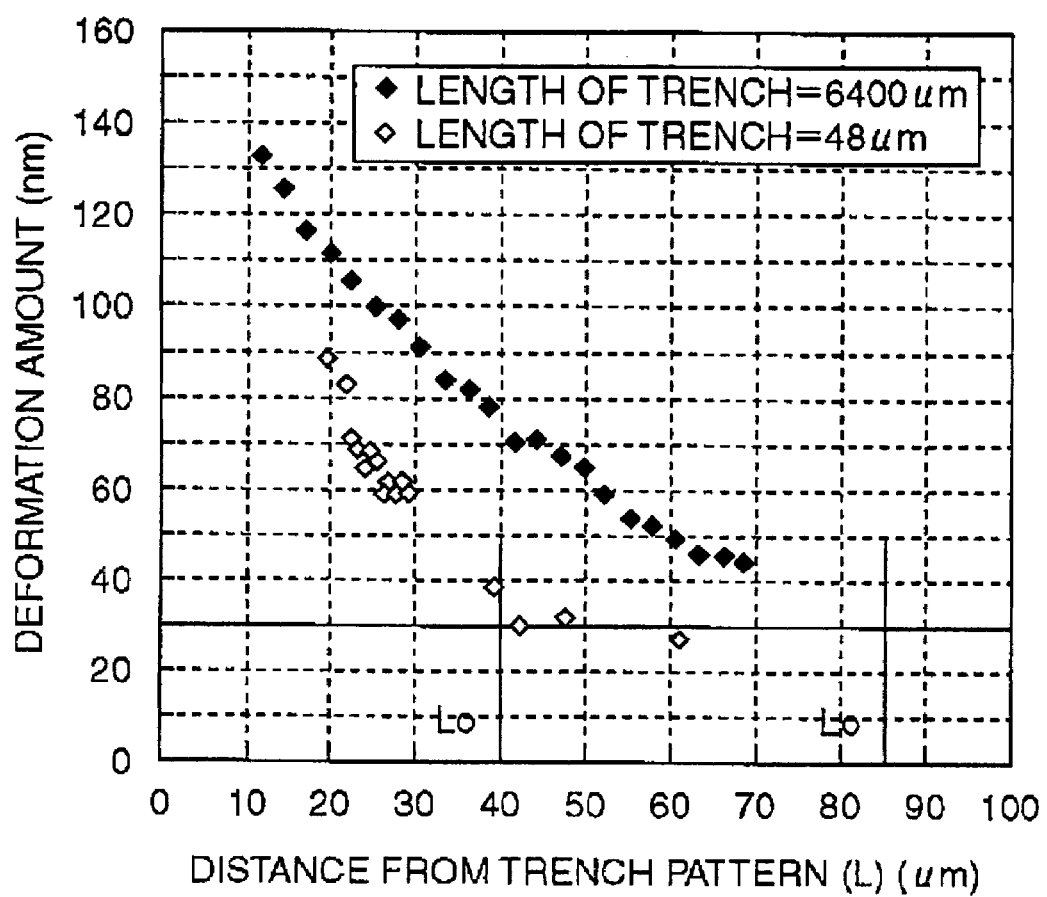
FIG. 10 is a graph showing the correlation between the distance from the trench pattern and a deformation amount.

For example, a deformation amount of a contact hole, which is formed in a position distant by L (μm) from a trench pattern 46 formed in the interlayer insulation film in the dicing line part 3 as shown in FIG. 9, varies as shown in FIG. 10. The deformation amount in FIG. 10 indicates a difference between the diameter of an upper end of the contact hole and the diameter of a lower end thereof, and a deformation amount at a center portion of a region surrounded by the dicing line part 3 is 30 nm. Therefore, when the deformation amount is 30 nm, it can be said that the deformation of the interlayer insulation film does not influence the contact hole. Therefore, it can be said that, when the length of the trench pattern 46 is 6400 μm (♦), the deformation of the interlayer insulation film does not influence a contact hole if the contact hole is about 86 μm distant from the trench pattern 46, and when the length of the trench pattern 46 is 48 μm (◇), the deformation of the interlayer insulation film does not influence a contact hole if the contact hole is about 40 μm distant from the trench pattern 46. Hereinafter, such a distance is referred to as a deformation influential distance, which will be represented by Lo.

Figure 11:
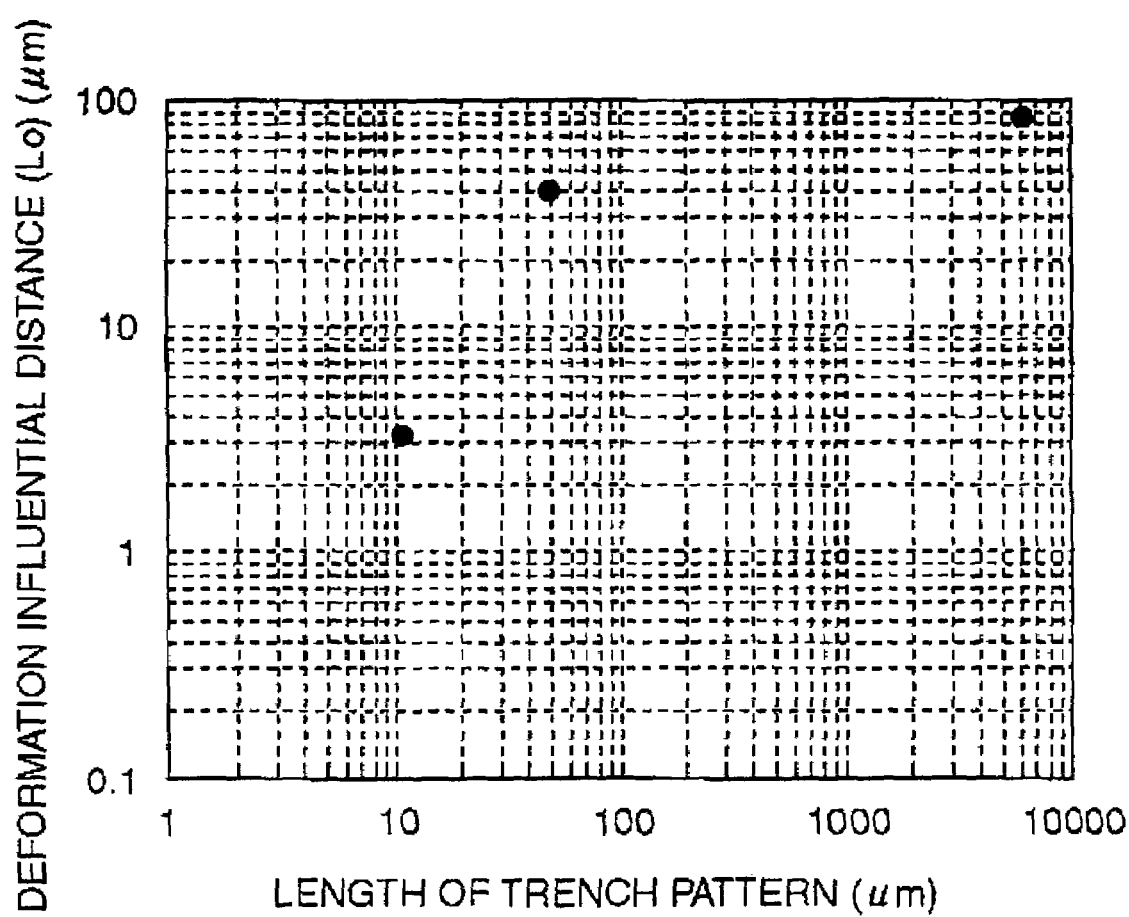
FIG. 11 is a graph showing the correlation between the length of the trench pattern and a deformation influential distance.

The correlation between the length of the trench pattern 46 and the deformation influential distance is shown as FIG. 11. As is apparent, the length of the trench pattern 46 is preferably set in consideration of the correlation shown in FIG. 11 when the trench pattern 46 such as the alignment mark is formed in the interlayer insulation film 17 in the dicing line part 3 concurrently with the contact holes 22 and 23. This is because a trench is not formed in the guard ring part 4 in this embodiment when the trench pattern 46 is formed as stated before so that the trench pattern 46 itself may act similarly to the trench 147 for the guard ring in the prior art.

Incidentally, though the deformation influential distance Lo is 3.2 μm in FIG. 11 when the length of the trench pattern is 11 μm, the deformation influential distance Lo may possibly be shorter than 3.2 μm. This is because the value 3.2 μm is the minimum distance between the trench pattern and the contact hole actually confirmed by the inventor of this application, and it has not been confirmed whether or not the deformation has an influence in the case of a smaller distance.

Incidentally, the first embodiment may be so modified that the gate oxide film 13, the wiring layer 14, and the side walls 16 are formed in the portion where the diffusion layer 15 in the guard ring part 4 is formed, and the trench 37 is formed to reach the wiring layer 14. In this case, strict adjustment of an excessive amount is not required in etching for forming the trench 37.

Second Embodiment

Figure 13:
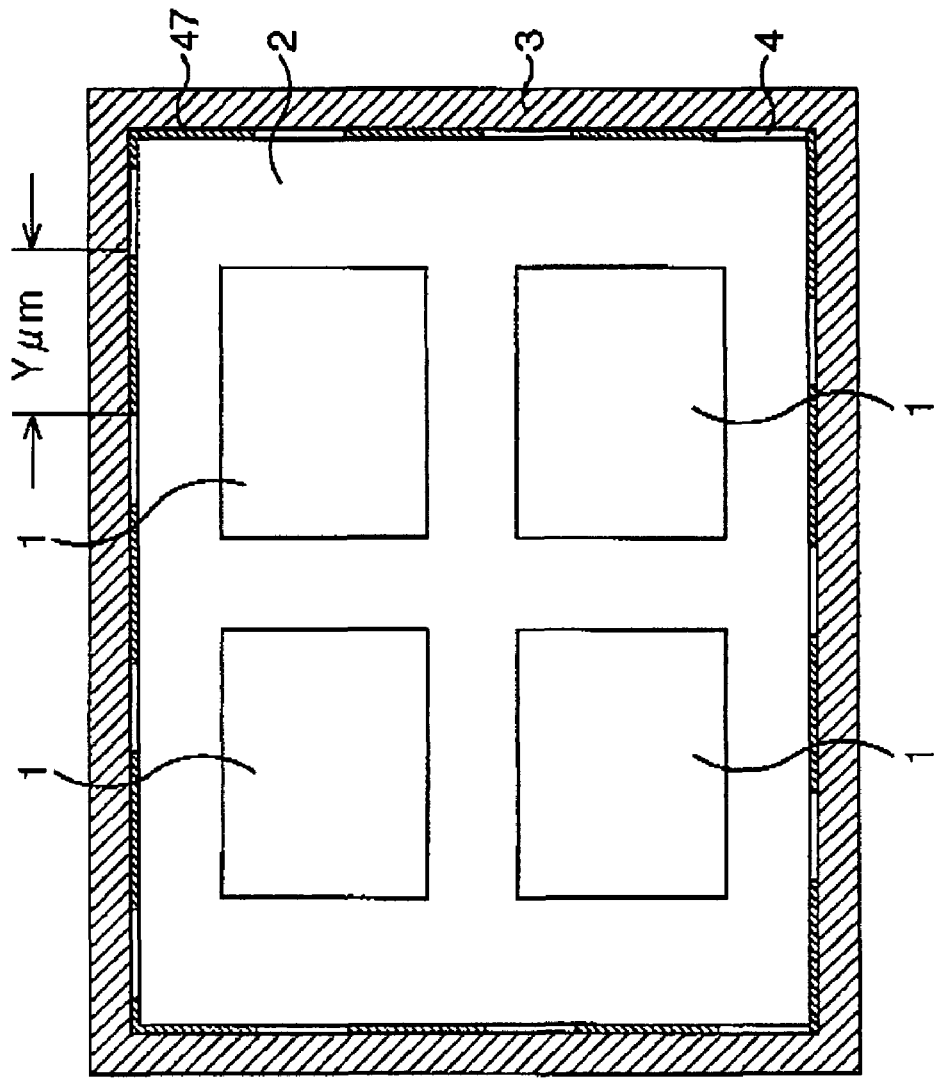
FIG. 13 is a schematic plan view showing the structure of a semiconductor device according to the second embodiment of the present invention.

Next, the second embodiment of the present invention will be explained. FIG. 13 is a schematic plan view showing the structure of a semiconductor device according to the second embodiment of the present invention.

In the second embodiment, unlike the first embodiment, contact holes 22 and 23 are formed in a peripheral circuit part 2 and at the same time, trenches 47 reaching a diffusion layer 15 are formed in a guard ring part 4. Note that the trenches 47 are arranged discontinuously in the guard ring part 4 provided on the boundary between the peripheral circuit part 2 and a dicing line part 3 as shown in FIG. 13, and each of the trenches 47 has a length so as to satisfy the correlation shown in FIG. 11. In other words, the length of each of the trenches 47 is determined according to the distance to the contact hole 22 or 23 in the peripheral circuit part 2 that is formed at the nearest position to this trench 47. More specifically, the shorter the distance to the contact hole 22 or 23 formed at the nearest position to the trench 47 is, the shorter the trench 47 itself is made.

A trench 37 is formed so as to reach wiring layers buried in the trenches 47, and not to reach the diffusion layer 15 unlike the first embodiment.

According to the second embodiment as described above, the contact holes 22 and 23 are formed in the peripheral circuit part 2, and at the same time, the trenches 47 reaching the diffusion layer 15 are formed in the guard ring part 4. However, since the length of each of the trenches 47 is appropriately adjusted, the contact holes 22 and 23 in the peripheral circuit part 2 are not deformed due to heat shrinkage of the interlayer insulation film 17.

Third Embodiment

Figure 14:
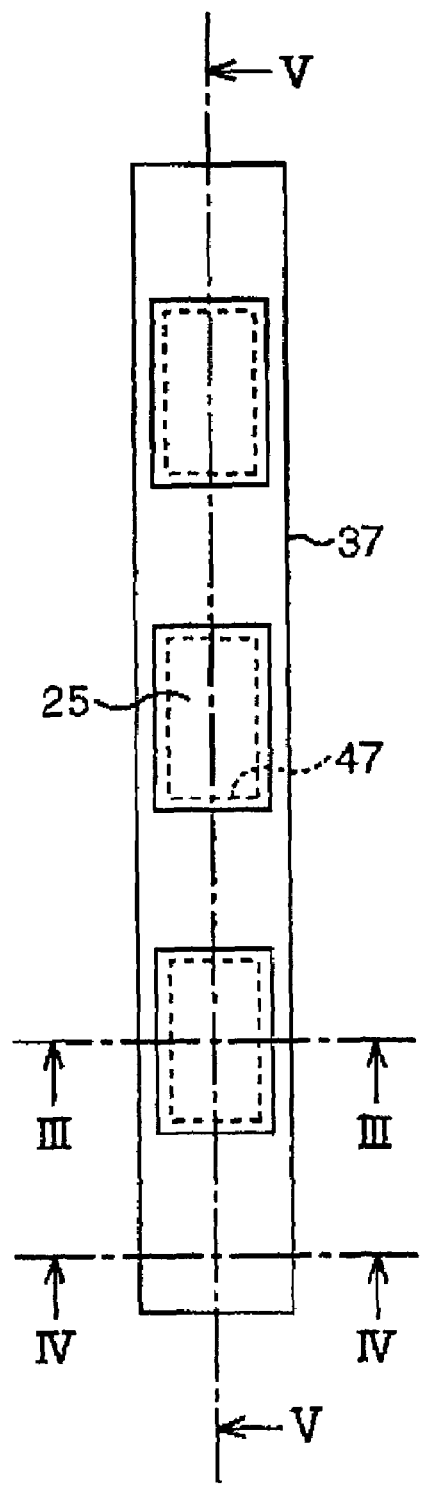
FIG. 14 is a schematic plan view showing the structure of a part of a guard ring part of a semiconductor device according to the third embodiment of the present invention.
Figure 15:
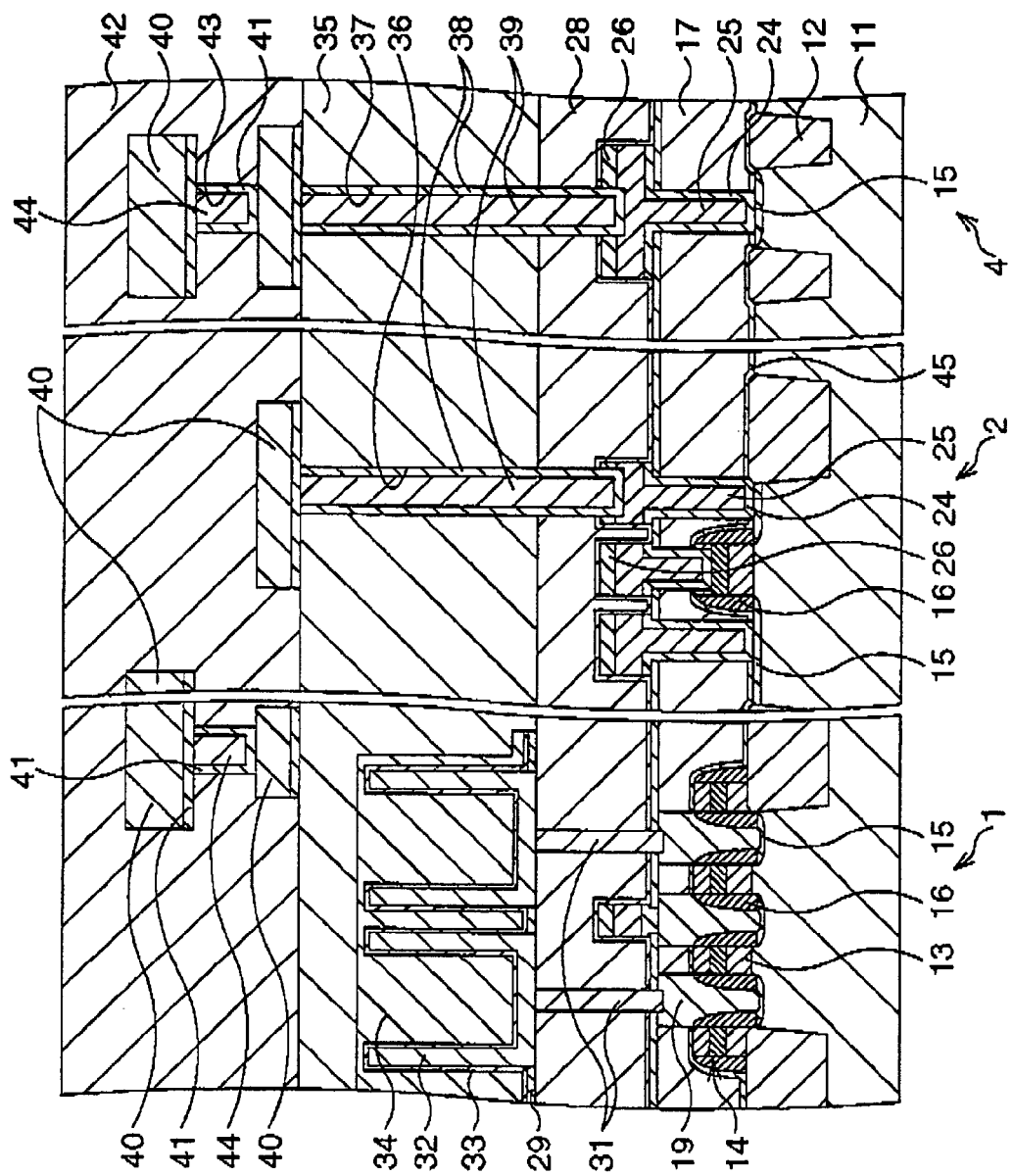
FIG. 15 is a sectional view taken along III—III line in FIG. 14.
Figure 16:
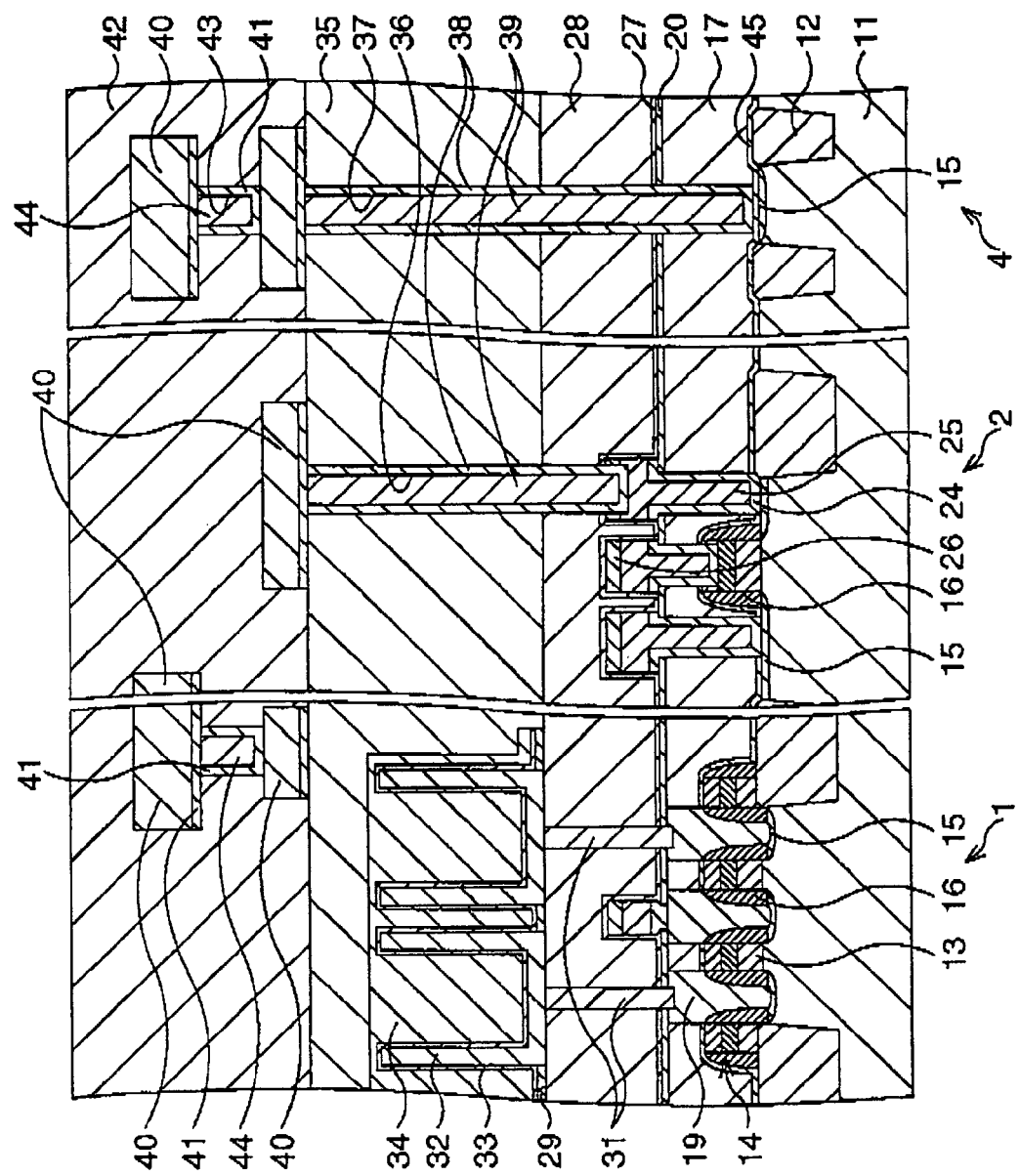
FIG. 16 is a sectional view taken along IV—IV line in FIG. 14.
Figure 17:
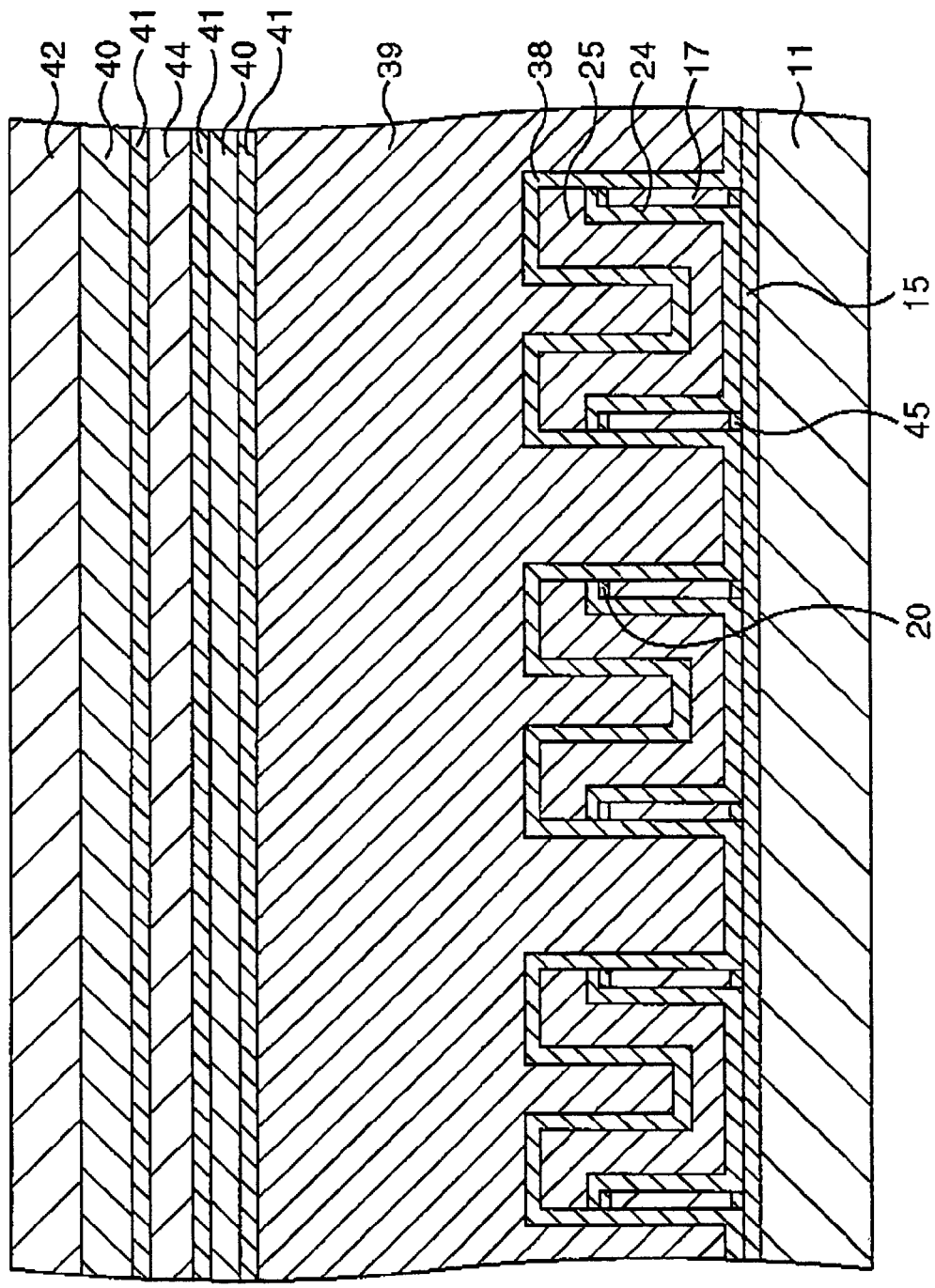
FIG. 17 is a sectional view taken along V—V line in FIG. 14.

Next, the third embodiment of the present invention will be explained. In the third embodiment, similarly to the first embodiment, a guard ring is formed in a ring shape. But it is different from the first embodiment in a layer structure thereof. FIG. 14 is a schematic plan view showing the structure of a part of a guard ring part of a semiconductor device according to the third embodiment of the present invention. FIG. 15 to FIG. 17 are sectional views taken along III—III line, IV—IV line, and V—V line in FIG. 14, respectively.

In this embodiment, similarly to the second embodiment, contact holes 22 and 23 are formed, and at the same time, trenches 47 are formed in an interlayer insulation film 17 in a guard ring part 4, being discontinuously arranged. At this time, the length of each of the trenches 47 is adjusted based on the same rule as in the second embodiment so as to satisfy the correlation shown in FIG. 11.

Thereafter, in each of the trenches 47, a barrier metal film 24 is formed, a wiring layer 25 is buried therein, and a SiON film 26 is formed over the wiring layer 25. Subsequently, similarly to the first embodiment, a series of the processes from the step of forming of a pressure-reduced SiN film 27 to the step of forming of an interlayer insulation film 35 are carried out.

Next, similarly to the first embodiment, contact holes 36 and a trench 37 are formed. At this time, contact holes, though not shown, reaching a part of wiring layers 14 or wiring layers positioned thereabove (not shown) may be formed at the same time. However, contact holes reaching diffusion layers 15 or a semiconductor substrate 11 in a memory cell array part 1 and a peripheral circuit part 2 are not formed. In a guard ring part 4, since the wiring layers 25 and so on are formed in parts thereof, the trench 37 does not reach the diffusion layer 15 and has a depth reaching the wiring layers 25 in these parts.

Next, similarly to the first embodiment, barrier metal films 38 and contact plugs 39 are formed, and upper wiring layers 40 and so on are further formed to complete a semiconductor device.

According to the third embodiment as described above, higher reliability is obtainable compared with the second embodiment since the peripheral circuit part 2 is completely surrounded by the wiring layers 25 and the contact plugs 39 formed in the guard ring part 4.

Fourth Embodiment

Figure 18:
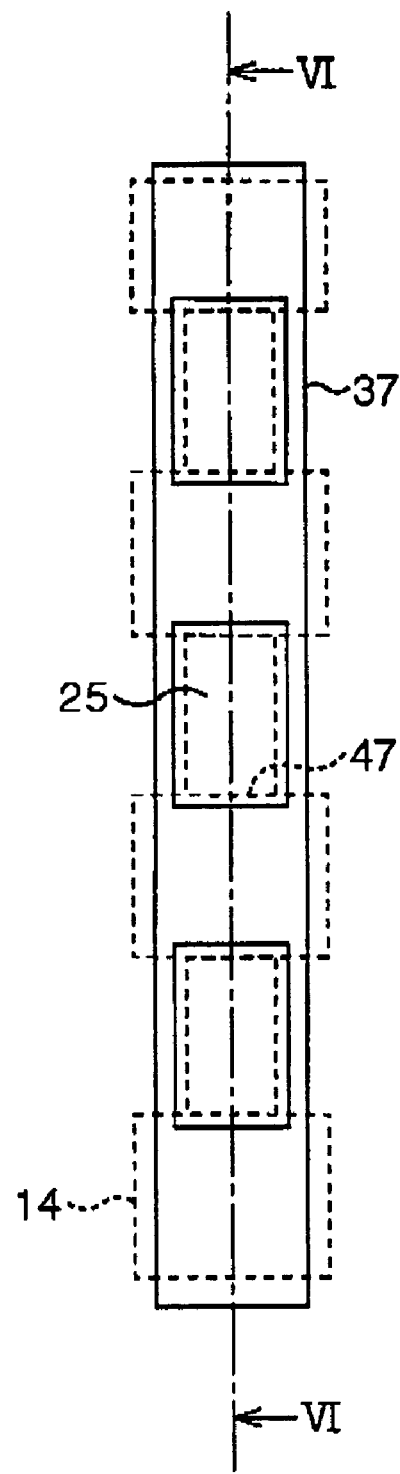
FIG. 18 is a schematic plan view showing the structure of a part of a guard ring part of a semiconductor device according to the fourth embodiment of the present invention.
Figure 19:
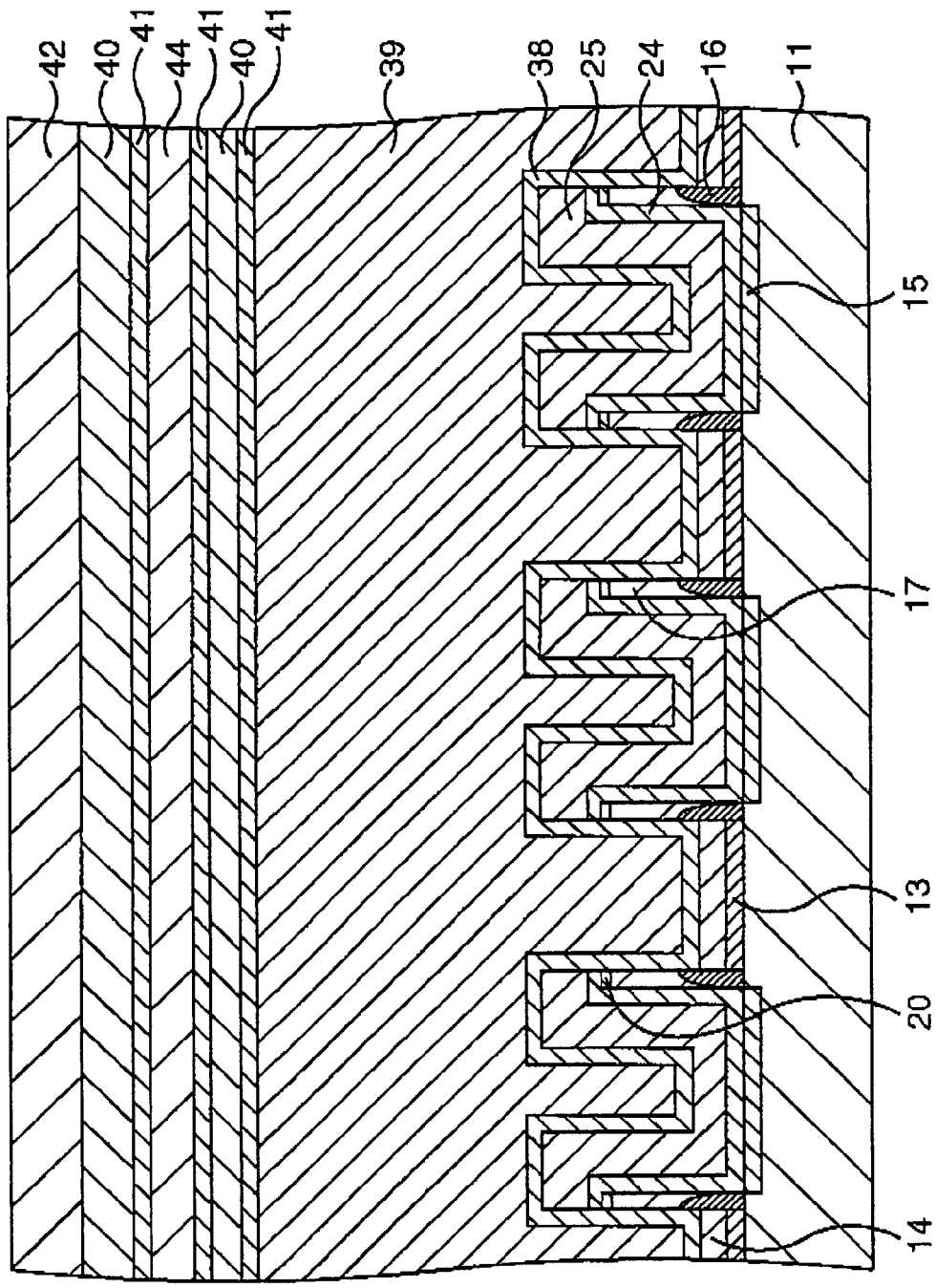
FIG. 19 is a sectional view taken along VI—VI line in FIG. 18.

Next, the fourth embodiment of the present invention will be explained. FIG. 18 is a schematic plan view showing the structure of a part of a guard ring part of a semiconductor device according to the fourth embodiment of the present invention. FIG. 19 is a sectional view taken along VI—VI line in FIG. 18.

Figure 12:
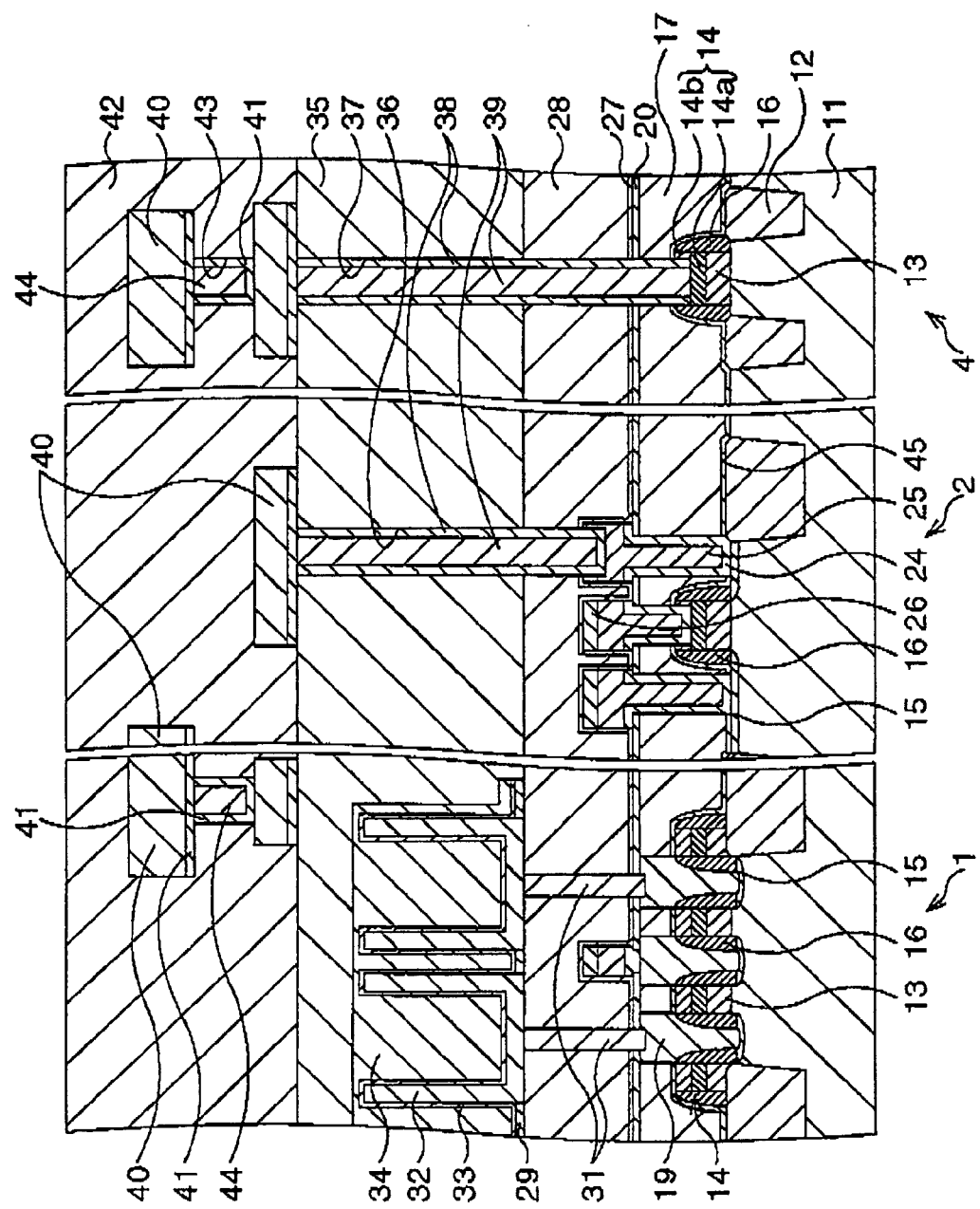
FIG. 12 is a sectional view showing a modification example of the first embodiment.

In this embodiment, the third embodiment is so modified that wiring layers 14 and so on are formed also in a guard ring part 4 as in the modification example of the first embodiment shown in FIG. 12. At this time, the wiring layers 14 and so on are formed, for example, in regions where the trenches 47 are not formed in the third embodiment. Then, trenches 47 are formed in an interlayer insulation film 17 similarly to the third embodiment.

According to the fourth embodiment as described above, the same effect is obtainable as that in the third embodiment, and such an effect is obtainable as well that strict adjustment of an excessive amount is not required when a trench 37 is formed, similarly to the modification example of the first embodiment.

Fifth Embodiment

Next, the fifth embodiment of the present invention will be explained. In the fifth embodiment, a guard ring part 4 is structured similarly to any of the first to the fourth embodiments, and a guard ring part for fuse portion having the same structure as that of the guard ring part 4 is provided around a fuse portion provided near a memory cell array part.

A cover film is formed over the entire surface, and thereafter the cover film in a fuse portion is removed by etching, in order to allow wirings to be cut as necessary. Because of this, there arises a possibility of moisture intrusion from this portion. In order to prevent this moisture intrusion, in the prior art, the guard ring part for fuse portion is provided around the fuse portion. This guard ring for fuse portion in the prior art is formed in a similar manner to the guard ring part 104 formed between the peripheral circuit part 102 and the dicing line part 103. This poses a problem, similarly to the guard ring part 104, that contact holes in its vicinity are deformed.

Figure 20:
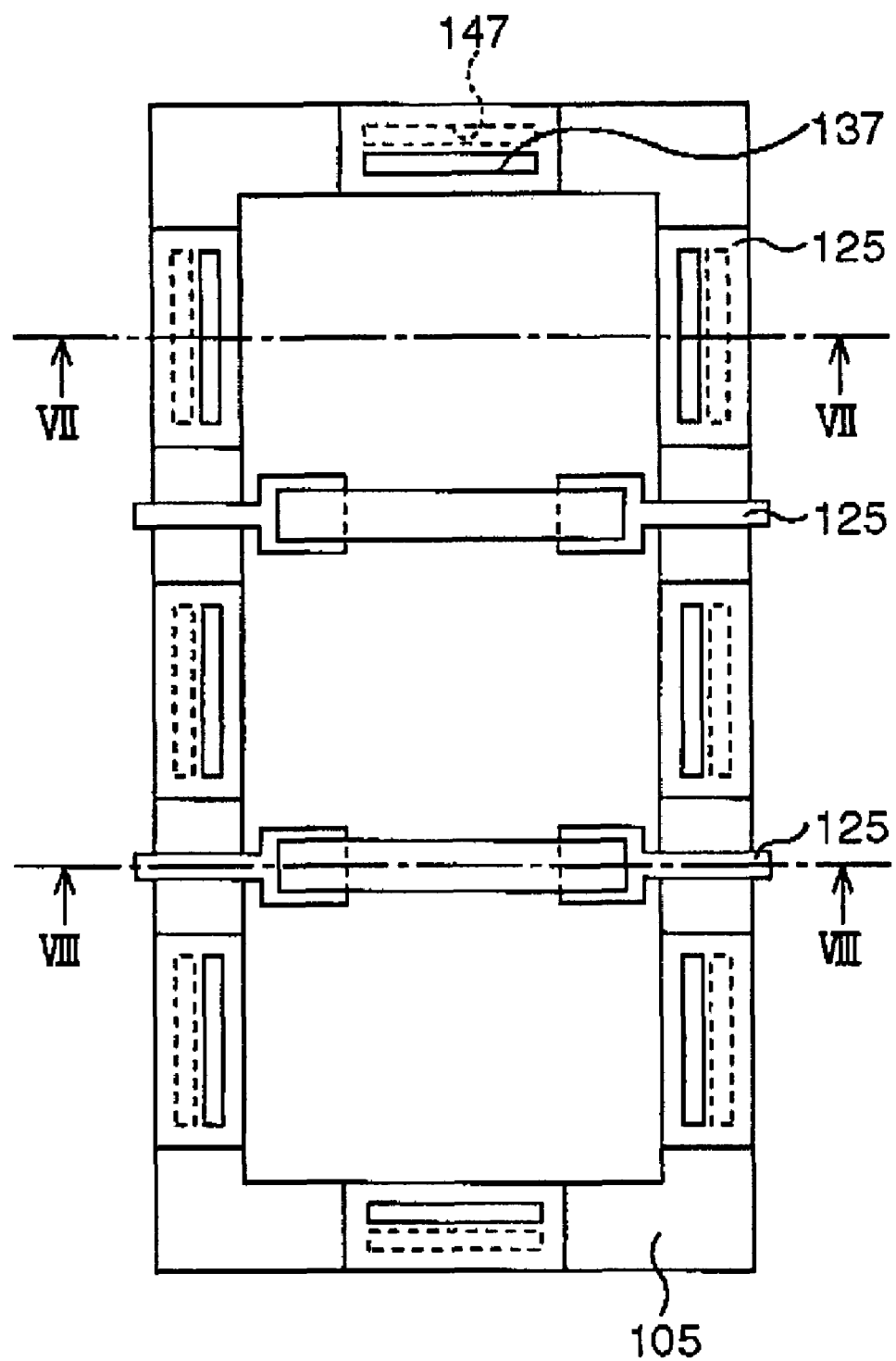
FIG. 20 is a schematic plan view showing the structure of a fuse portion of a semiconductor device in a prior art.
Figure 21A:
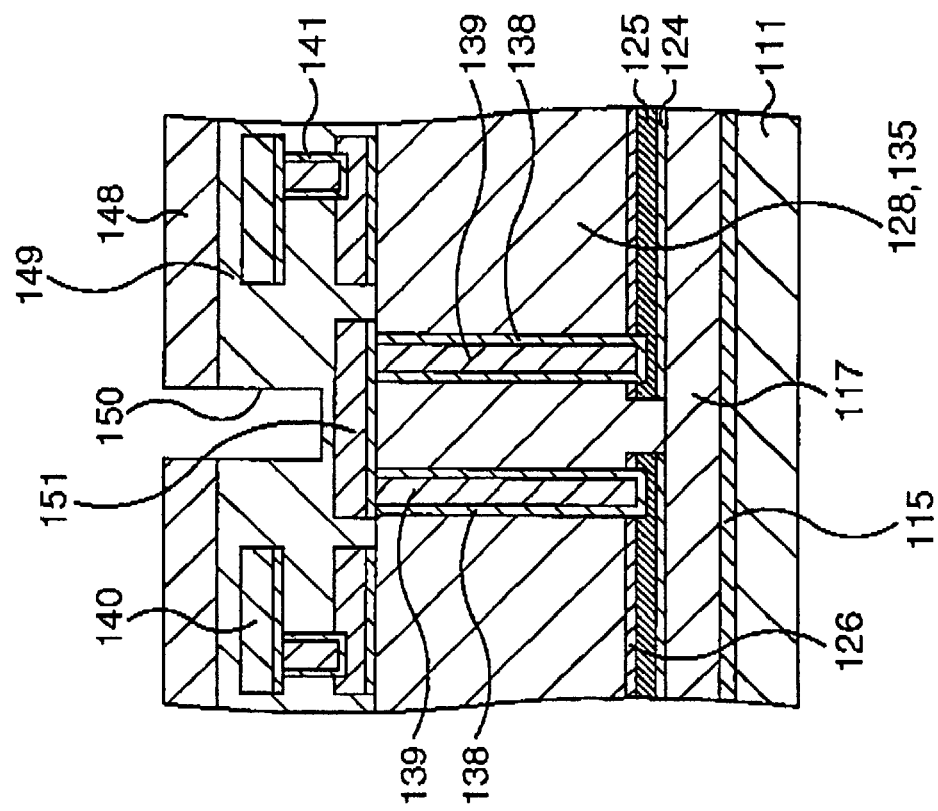
FIG. 21A and FIG. 21B are sectional views taken along VI—VII line and VIII—VIII line in FIG. 20, respectively.
Figure 21B:
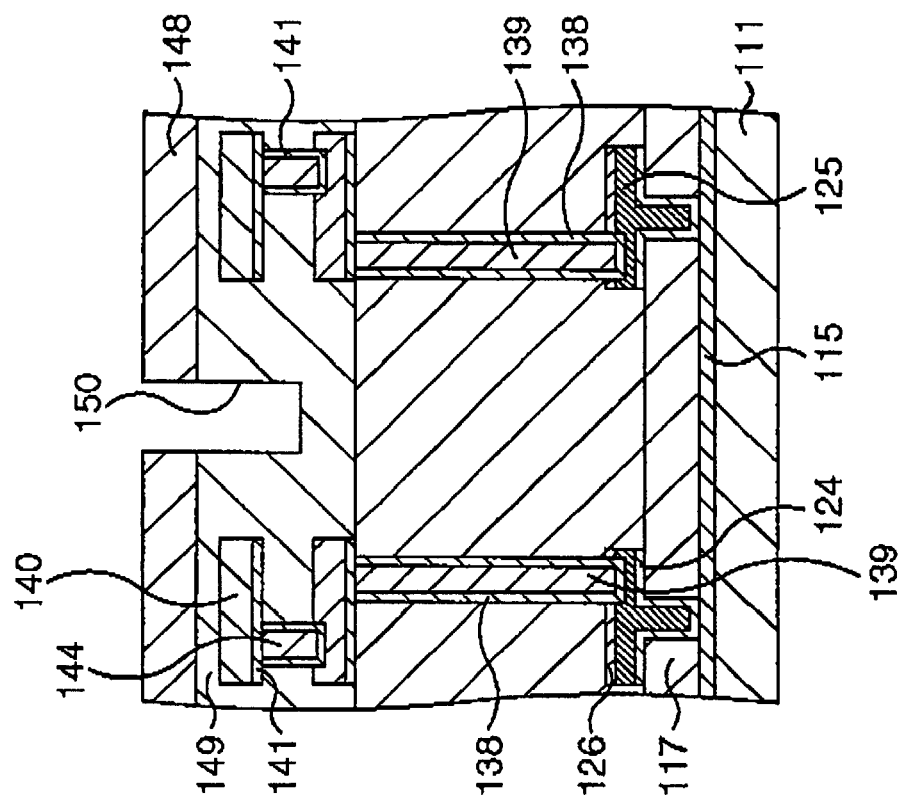
Figure 22:
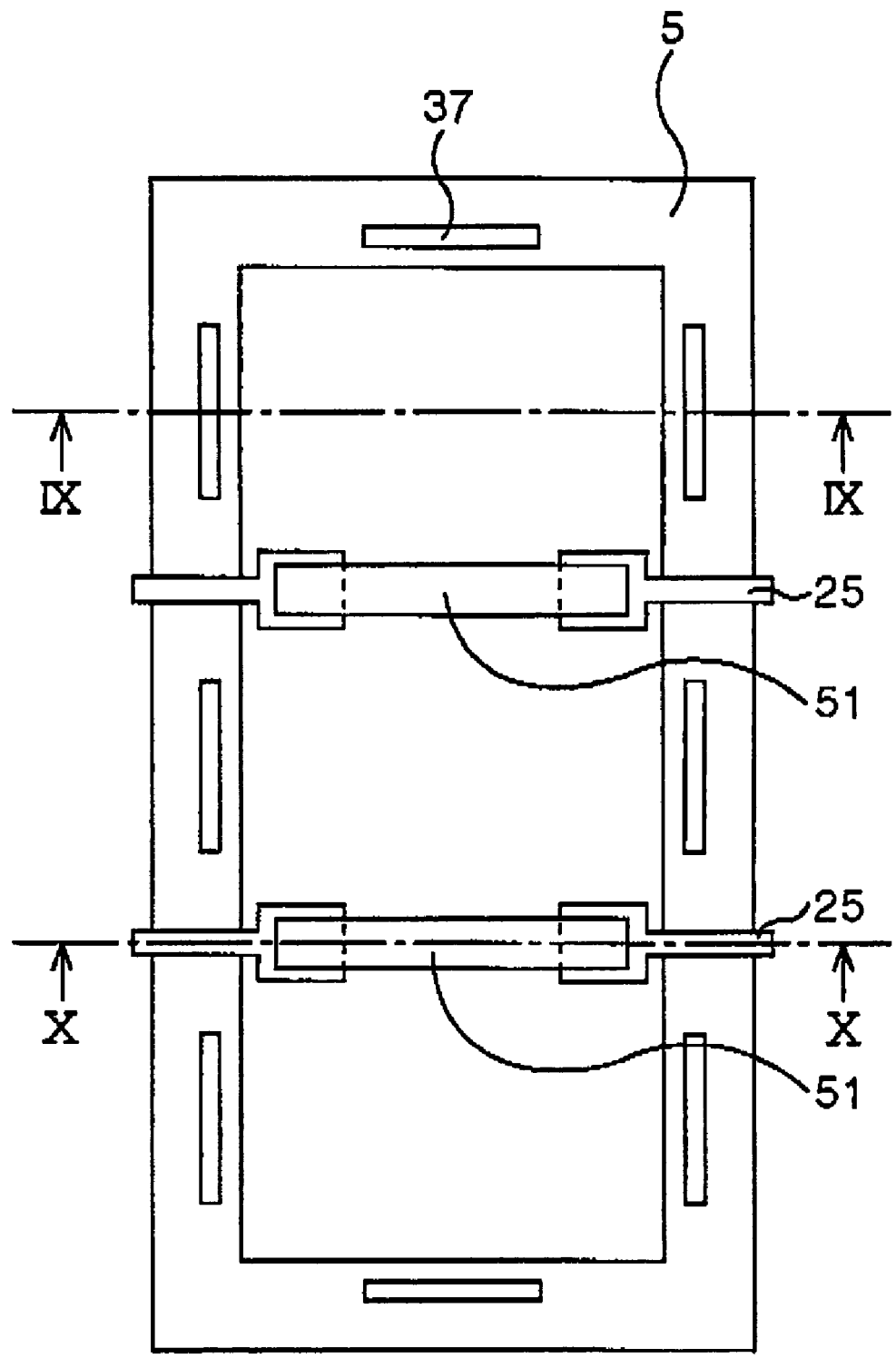
FIG. 22 is a schematic plan view showing the structure of a fuse portion of a semiconductor device according to the fifth embodiment of the present invention.
Figure 23B:
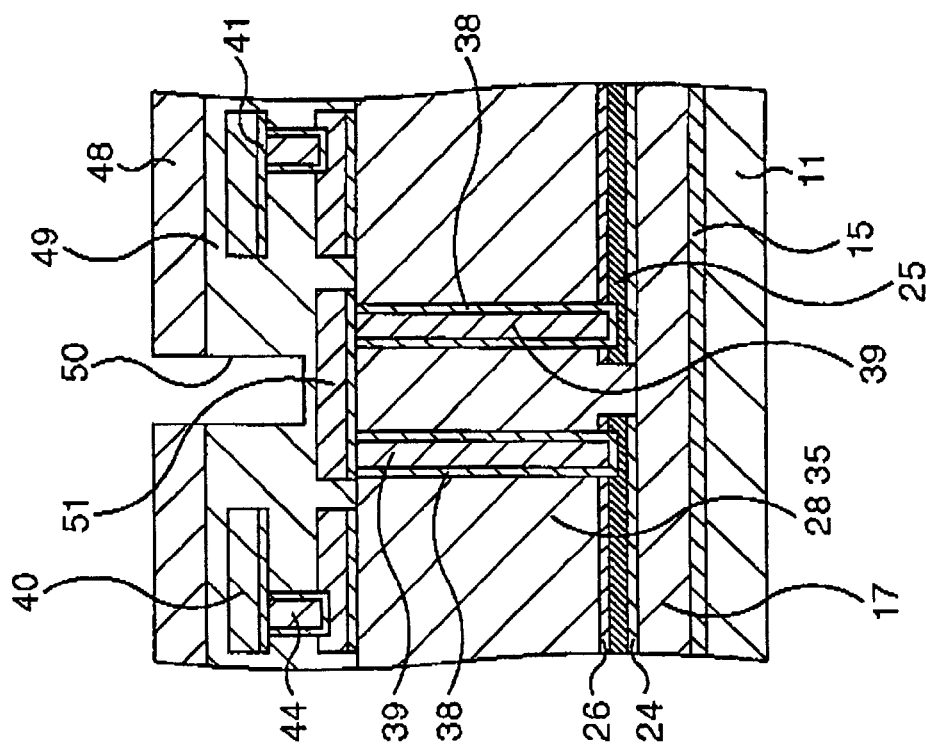
FIG. 23A and FIG. 23B are sectional views taken along IX—IX line and X—X line in FIG. 22, respectively.
Figure 23A:
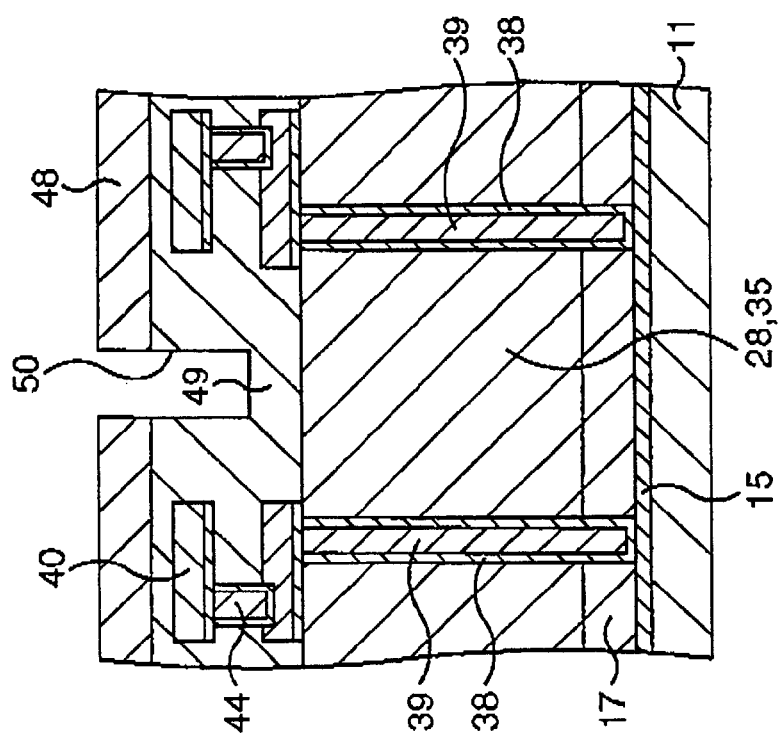

FIG. 20 is a schematic plan view showing the structure of the fuse portion of the semiconductor device in the prior art. FIG. 21A is a sectional view taken along VII—VII line in FIG. 20 and FIG. 21B is a sectional view taken along VIII—VIII line in FIG. 20. FIG. 22 is a schematic plan view showing the structure of the fuse portion of a semiconductor device according to the fifth embodiment of the present invention. FIG. 23A and FIG. 23B are sectional views taken along IX—IX line and X—X line in FIG. 22, respectively.

In the fuse portion of the prior semiconductor device, a cover film (moisture resistant protective film) 148 and an insulation film 149 directly thereunder are etched to form a fuse window 150, as shown in FIG. 20 and FIGS. 21A and 21B. Parts of upper wiring layers 140 below the fuse window 150 are cut parts 151. A guard ring part 105 for fuse portion is provided to surround the cut parts 151 in a plane view.

Figure 30:
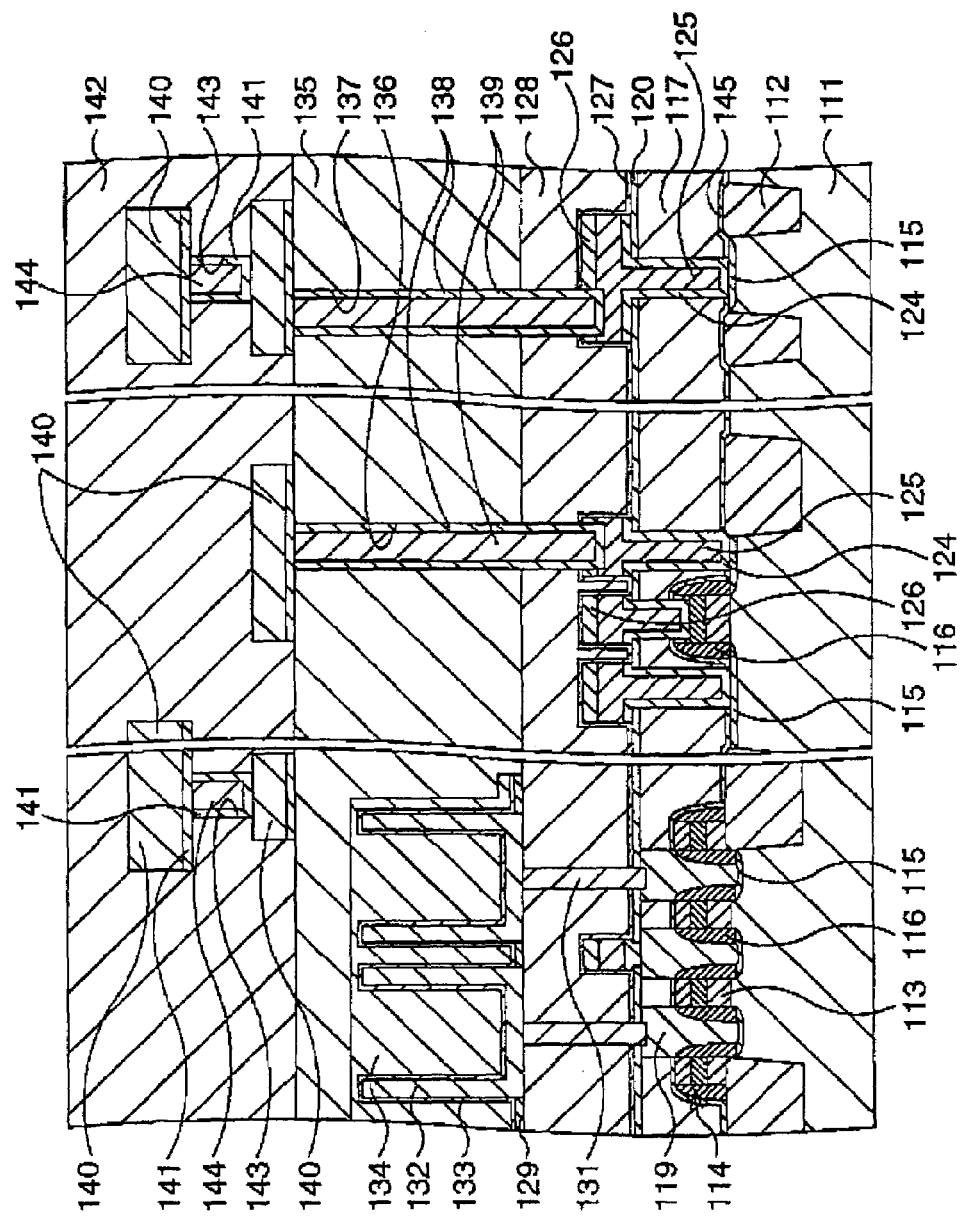
FIG. 30, which is similarly a view showing the manufacturing method of the semiconductor device in the prior art, is a sectional view showing a subsequent step to the step shown in FIG. 29.
Figure 31:
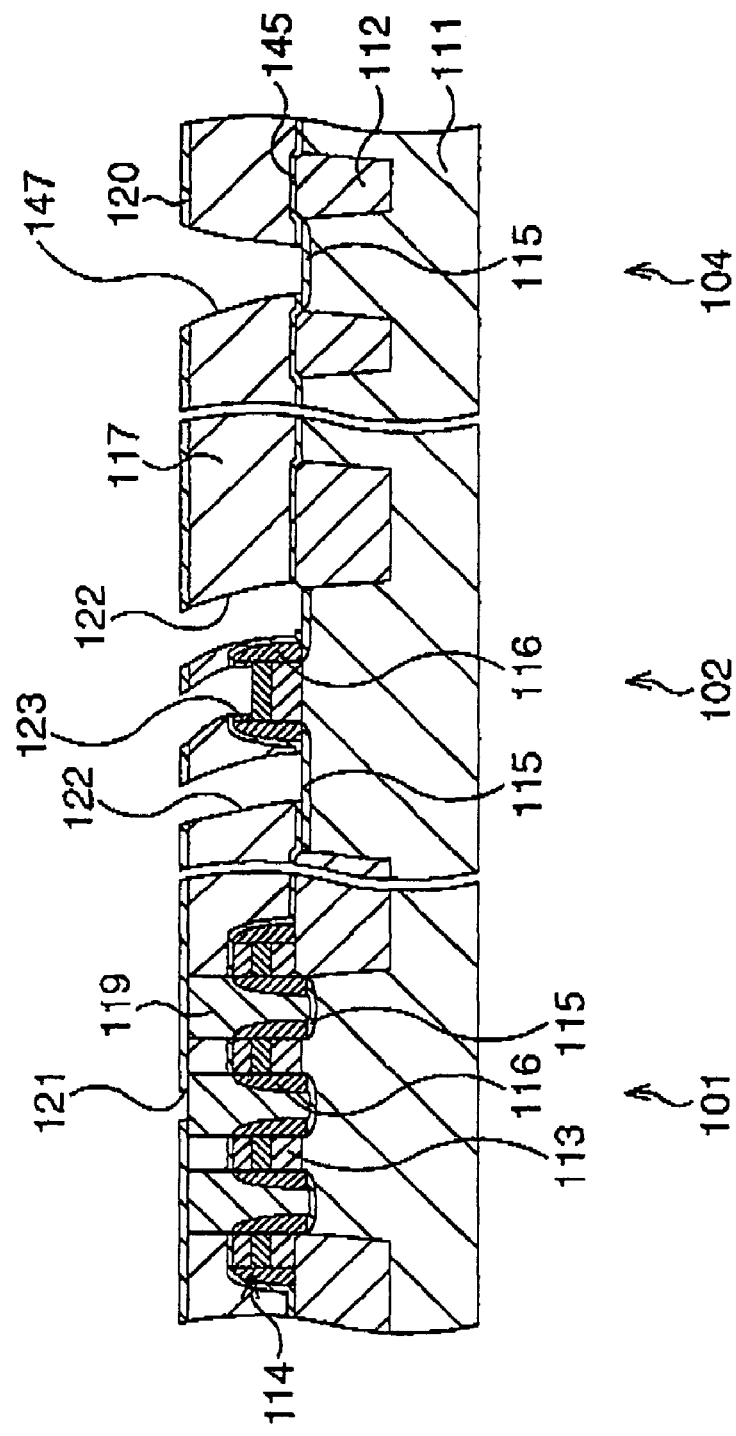
FIG. 31 is a sectional view showing heat shrinkage of an interlayer insulation film and contact hole deformation.

The formation of this guard ring part 105 for fuse portion prevents moisture, even when it enters from the fuse window 150, from reaching the memory cell array part 101 and so on. However, a cross sectional structure of the guard ring part 105 for fuse portion is similar to that of the guard ring part 104 shown in FIG. 30 and so on. Accordingly, the interlayer insulation film 117 suffers heat shrinkage in the middle of its manufacturing processes, which causes the deformation of the contact holes 121 to 123 (not shown in any of FIG. 20 and FIGS. 21A and 21B) in the peripheral circuit part 102.

In this embodiment, on the other hand, as shown in FIG. 22 and FIGS. 23A and 23B, a cover film (moisture resistant protective film) 48 and an insulation film 49 directly thereunder are etched to form a fuse window 50. Parts of an upper wiring layer 40, which are parts existing under the fuse window 50, are cut parts 51. The cut parts 51 are connected to wiring layers 25 via contact plugs 39.

A guard ring part 5 for fuse portion is provided to surround the cut parts 51 in a plan view. In the guard ring part 5 for fuse portion, a trench 37 passing through interlayer insulation films 35, 28, and 17 is formed. The trench 37 in this embodiment is not in a ring shape as in the first embodiment, but the plural trenches 37 are discontinuously arranged similarly to the trenches 47 in the second embodiment.

According to the fifth embodiment as described above, the contact hole deformation in the peripheral circuit part 2 near the fuse portion can be prevented.

Incidentally, the fifth embodiment may be so modified that contact holes 22 and 23 are formed in the peripheral circuit part 2, and at the same time, trenches passing through the interlayer insulation film 17 to reach the semiconductor substrate 11 similarly to the trenches 47 are formed in the guard ring part 5 for fuse potion. In this case, however, it is preferable that the length of each of the trenches is adjusted so as to satisfy the correlation shown in FIG. 11. Specifically, it is preferable that the trench itself is made shorter as the distance thereof to the contact hole 22 or 23 formed at a position nearest to this trench is shorter.

Sixth Embodiment

Figure 24:
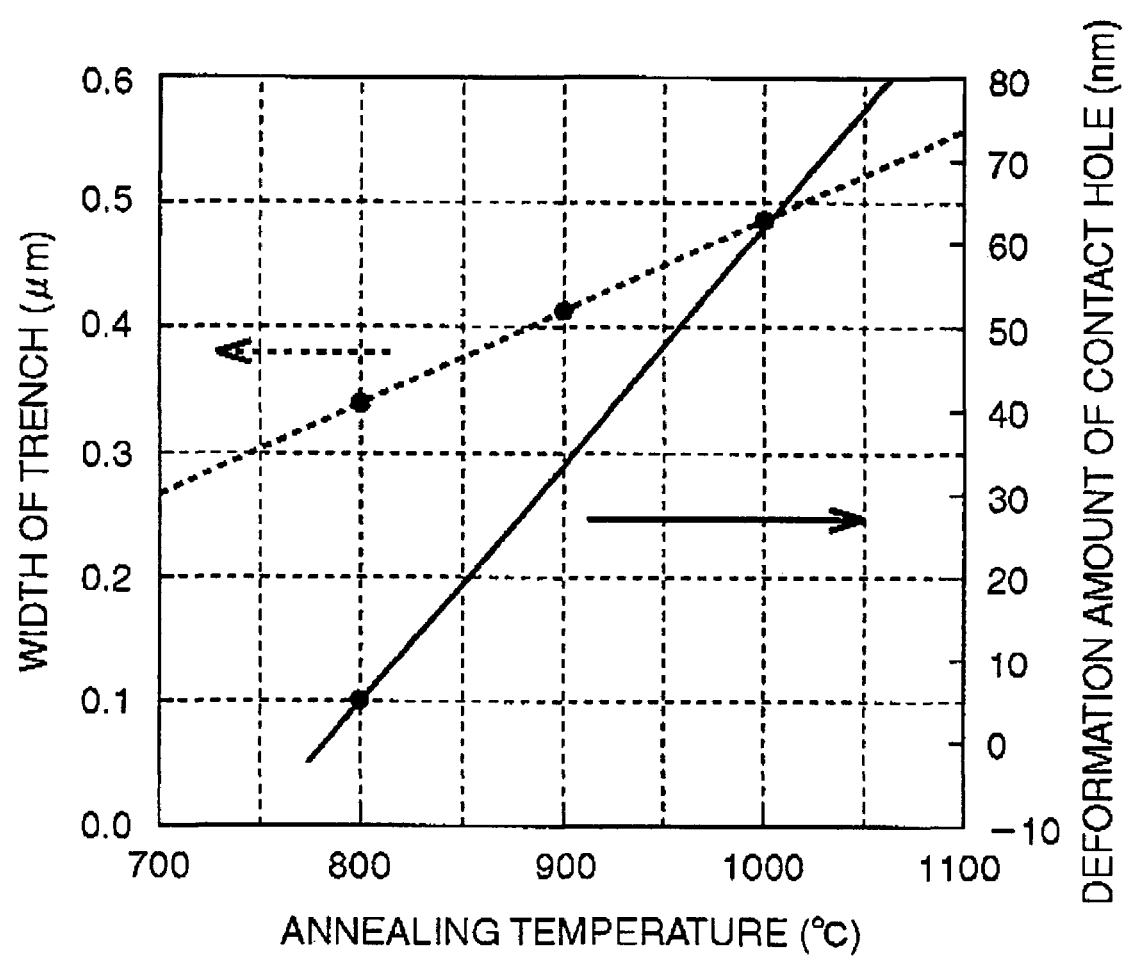
FIG. 24 is a graph showing the correlation between annealing temperature and a maximum deformation amount of a contact hole.
Figure 25:
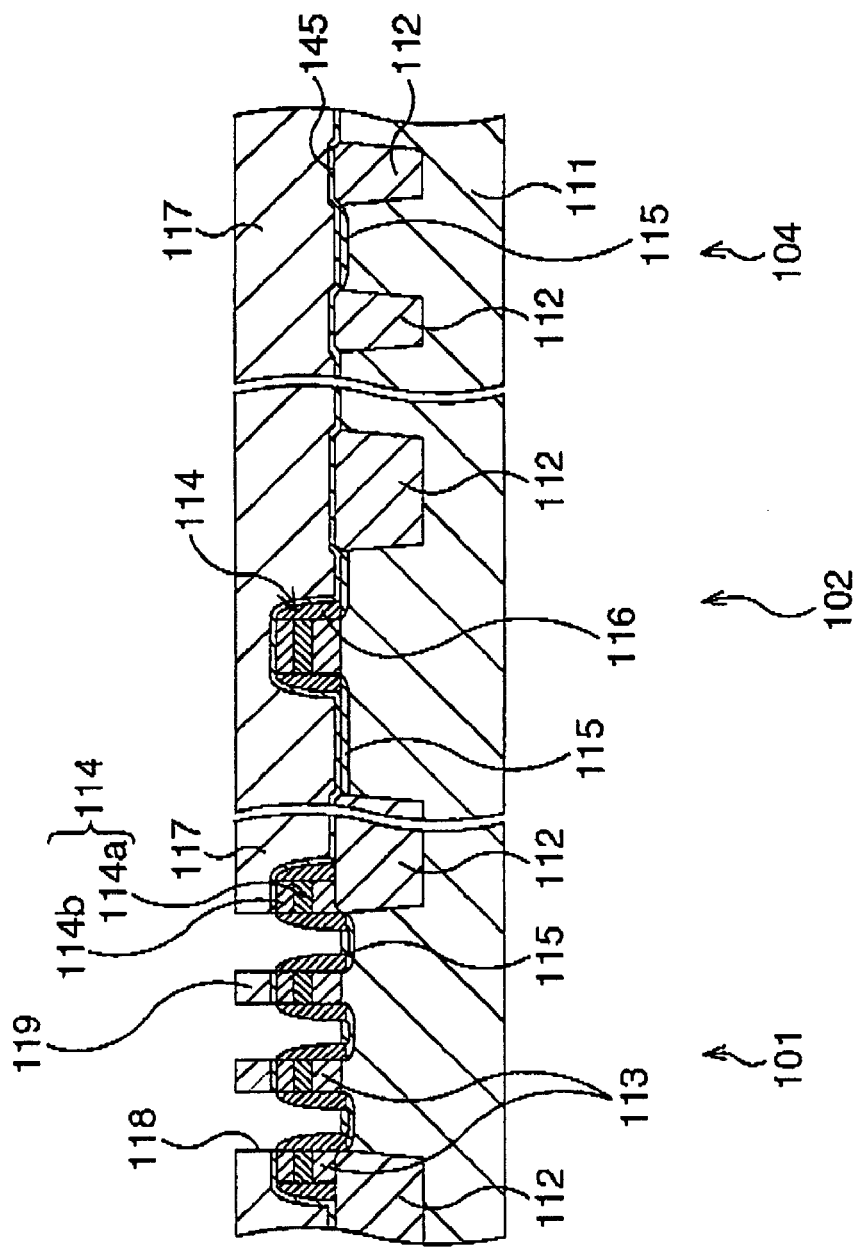
FIG. 25 is a sectional view showing a manufacturing method of the semiconductor device in the prior art.
Figure 26:
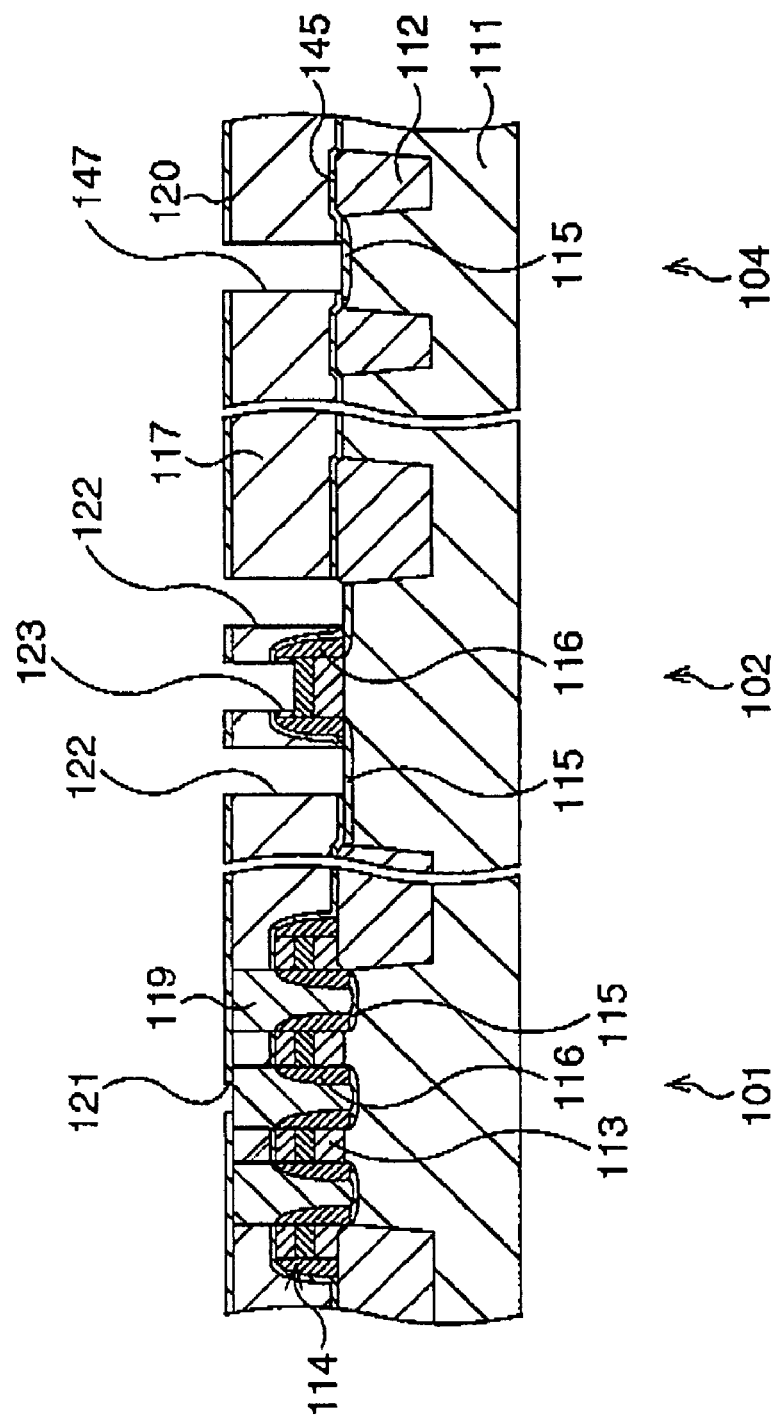
FIG. 26, which is similarly a view showing the manufacturing method of the semiconductor device in the prior art, is a sectional view showing a subsequent step to the step shown in FIG. 25.
Figure 27:
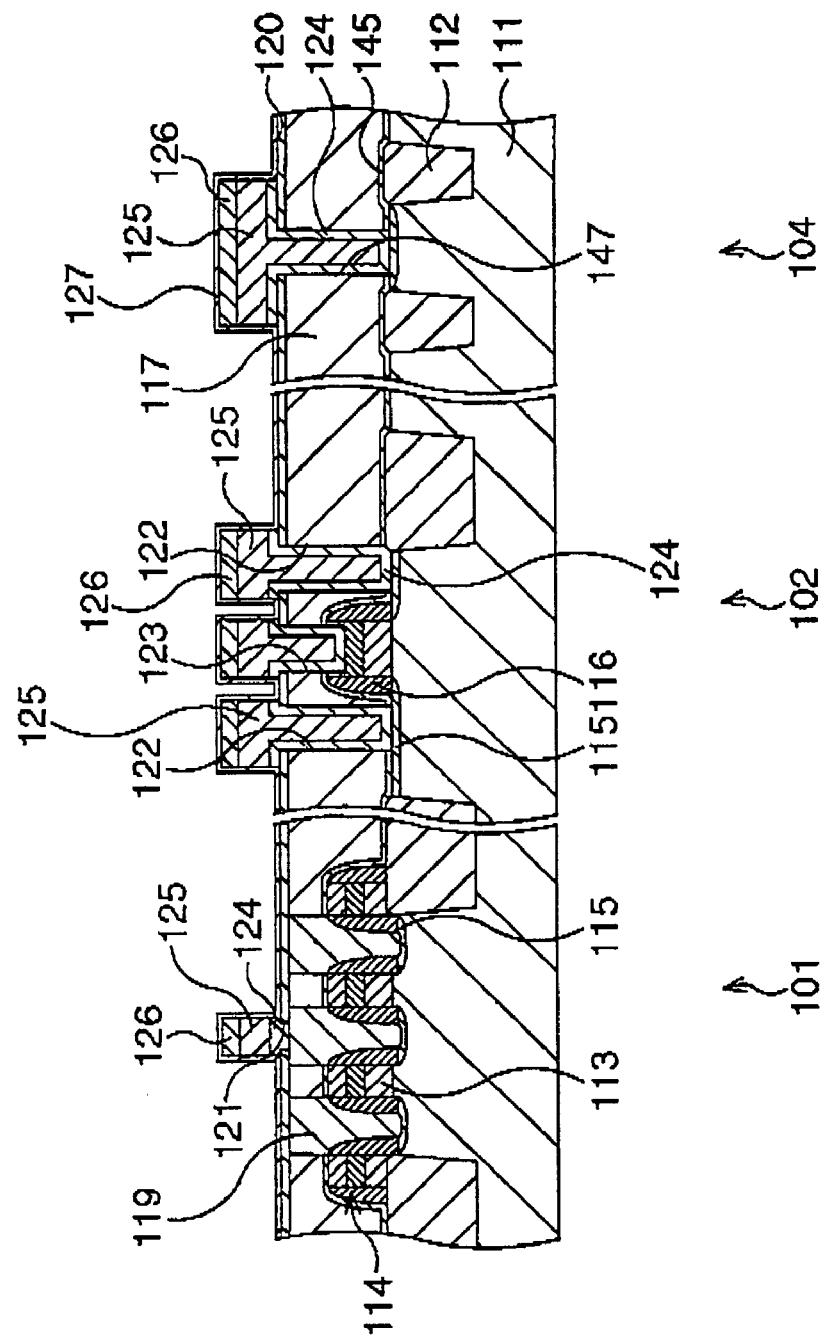
FIG. 27, which is similarly a view showing the manufacturing method of the semiconductor device in the prior art, is a sectional view showing a subsequent step to the step shown in FIG. 26.
Figure 28:
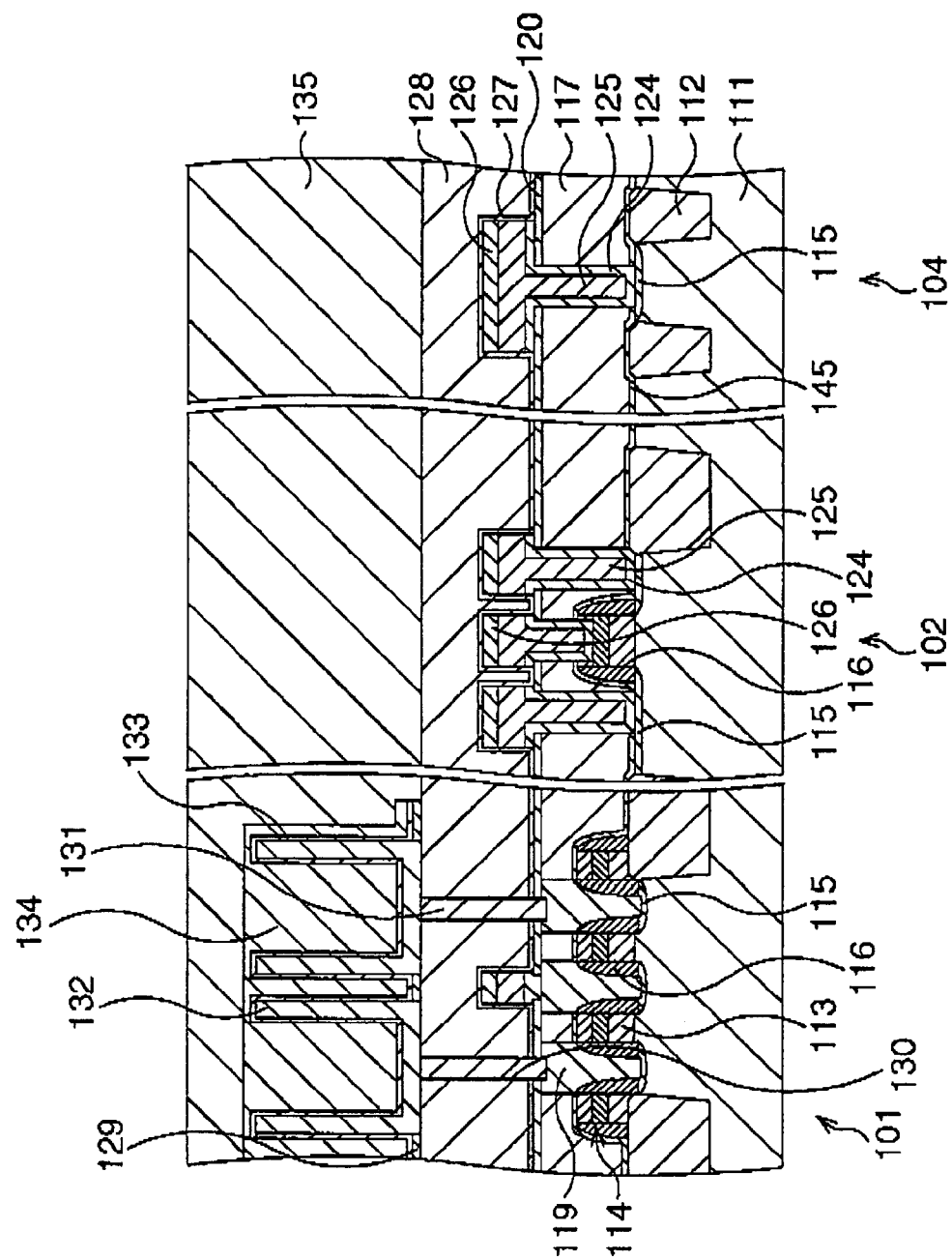
FIG. 28, which is similarly a view showing the manufacturing method of the semiconductor device in the prior art, is a sectional view showing a subsequent step to the step shown in FIG. 27.
Figure 29:
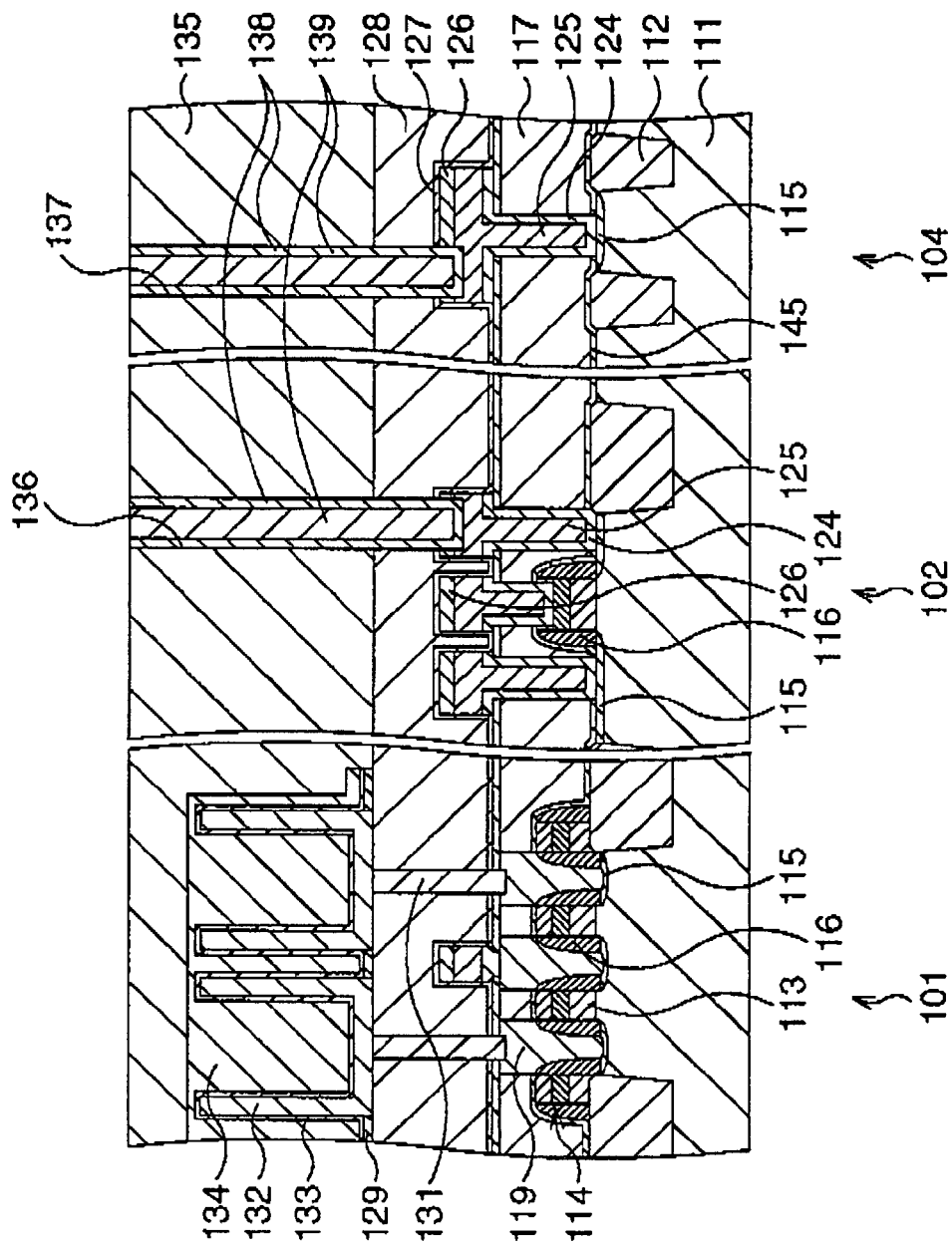
FIG. 29, which is similarly a view showing the manufacturing method of the semiconductor device in the prior art, is a sectional view showing a subsequent step to the step shown in FIG. 28.

Next, the sixth embodiment of the present invention will be explained. A semiconductor device in the sixth embodiment has the same structure as that of the conventional one shown in FIG. 30 and so on. However, after the contact holes 122, 123 and the trench 147 are formed, annealing for lowering a contact resistance, which is conducted before the wiring layers 125 are buried, is conducted at a temperature of 800° C. or lower. FIG. 24 is a graph showing the correlation between annealing temperature for lowering a contact resistance and a maximum deformation amount of the contact holes 121 to 123 in the peripheral circuit part 102, the horizontal axis taking the annealing temperature and the vertical axis taking the maximum deformation. Note that FIG. 24 also shows for reference the correlation between the annealing temperature and the width of an upper end portion of the trench after the annealing.

As shown in FIG. 24, at the annealing temperature of 800° C. or lower, the contact hole deformation amount is 0.5 nm or smaller even with the same structure as that of the prior art. Therefore, wiring layers can be sufficiently buried in the contact holes.

Incidentally, embodiments including these modification examples may be combined to constitute a semiconductor device. Further, in these embodiments, a DRAM is manufactured. The present invention is, however, applicable to semiconductor devices besides the DRAM. Moreover, the interlayer insulation film may be formed directly above the semiconductor substrate.

Figure 32:
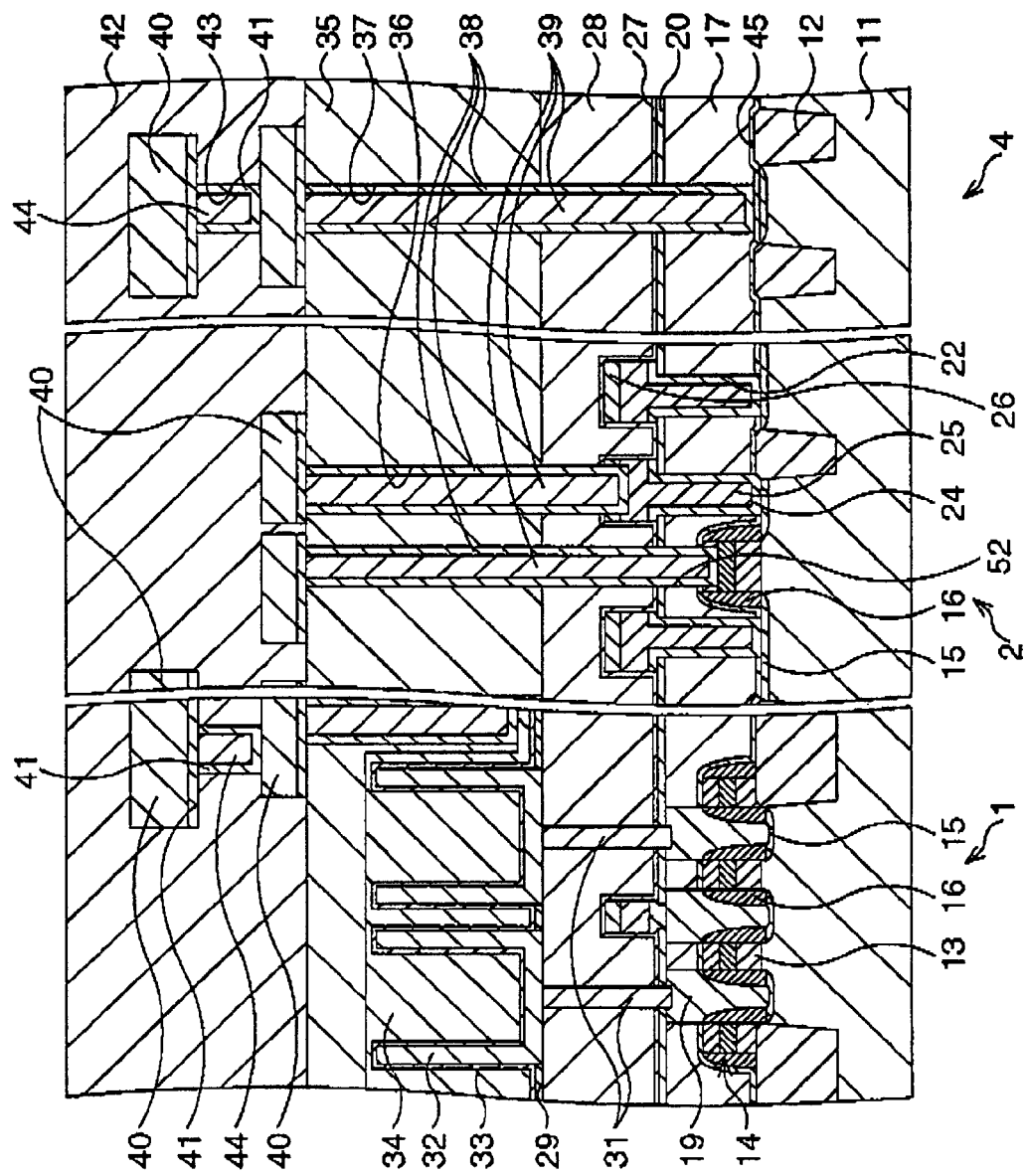
FIG. 32 is a sectional view showing a second modification example of the first embodiment.

Here, in these embodiments, in forming the contact holes 36 and the trench 37, the contact holes reaching a part of the wiring layers 14 may be concurrently formed, or the contact holes reaching the wiring layers (not shown) positioned in layers upper than the wiring layers 14 may be concurrently formed, as described above. FIG. 32 is a sectional view showing the structure when the first embodiment is so modified (a second modification example) that contact holes reaching gate portions in the peripheral circuit part 2 are formed concurrently with the contact holes 36.

In this modification example, the contact holes 23 are not formed when the contact holes 21 and 22 are formed. Instead, contact holes 52 reaching a part of the wiring layers 14 corresponding to the gate portions are formed when the contact holes 36 are formed. This indicates that the contact holes 23 and the contact holes 22 are not necessarily formed concurrently and that the contact holes 23 themselves do not have to be formed.

In FIG. 32, it is also indicated that the contact holes 22 are formed in the peripheral circuit part 2 for the diffusion resistances and so on requiring the substrate contact and that the upper wiring layers 40 are connected to the opposing electrodes 34 in the memory cell array part 1.

As is detailed hitherto, according to the invention relating to a semiconductor device, the trench in the guard ring part is formed to pass through the first and second interlayer insulation films, or the length thereof is adjusted appropriately according to the distance to the contact hole in the integrated circuit part. Consequently, heat shrinkage of the interlayer insulation film starting from the trench in the guard ring part can be alleviated so that contact hole deformation during the manufacturing processes of the semiconductor device can be prevented. Therefore, high reliability can be secured.

According to the invention relating to the manufacturing method of the semiconductor device, the trench is formed while the contact holes have buried materials therein, the length of the trenches are appropriately adjusted, or the process temperature is appropriately adjusted. Consequently, heat shrinkage of the interlayer insulation film can be alleviated so that contact hole deformation can be prevented. Therefore, high reliability can be secured.

The present embodiments are to be considered in all respects as illustrative and no restrictive, and all changes which come within the meaning and range of equivalency of the claims are therefore intended to be embraced therein. The invention may be embodied in other specific forms without departing from the sprit or essential characteristics thereof.

What is claimed is:

1. A semiconductor device, comprising:
   a semiconductor substrate;
   an integrated circuit part formed on said semiconductor substrate; and
   a guard ring part formed on said semiconductor substrate and surrounding said integrated circuit part to prevent moisture intrusion from the outside,
   wherein said integrated circuit part includes:
   a gate insulation film formed on said semiconductor substrate;
   a gate electrode formed on said gate insulation film; and
   a pair of impurity diffusion layers formed in a surface of said semiconductor substrate to sandwich said gate electrode in a plan view, and
   said semiconductor device further comprises:
   a first interlayer insulation film which covers at least said gate electrode and said pair of impurity diffusion layers, and is formed to extend over said integrated circuit part and said guard ring part, and in which first contact holes reaching at least said pair of impurity diffusion layers are formed;
   a wiring layer formed on said first interlayer insulation film and connected to at least said pair of impurity diffusion layers via said first contact holes; and
   a second interlayer insulation film formed on said first interlayer insulation film and covering said wiring layer, in said second interlayer insulation film second contact holes reaching said wiring layer being formed in said integrated circuit part,
   said first and second interlayer insulation films have a trench reaching said semiconductor substrate only in said guard ring part and deeper than said second contact holes, and
   said trench and said second contact holes have a buried conductive layer buried therein.

2. The semiconductor device according to claim 1, wherein said trench is formed in a continuous ring shape.

3. The semiconductor device according to claim 1, further comprising:
a dicing part formed on said semiconductor substrate and surrounding guard ring part,
wherein said first interlayer insulation film is formed to extend over said integrated circuit part, said guard ring part, and said dicing part,
a plurality of dicing part trench patterns reaching said semiconductor substrate are formed in said first interlayer insulation film in said dicing part, and
each of said plurality of dicing part trench patterns is formed to be shorter in length than the distance from each of said plurality of dicing part trench patterns to a nearest contact hole among said contact holes.

4. The semiconductor device according to claim 1, wherein said first interlayer insulation film contains at least one kind of element selected from a group of boron and phosphorous.

5. The semiconductor device according to claim 1, wherein said first interlayer insulation film is formed of a plurality of layered films, and a first insulator layer on a side nearest to said semiconductor substrate contains at least one kind of element selected from a group of boron and phosphorous.

6. The semiconductor device according to claim 5, wherein said first insulator layer is made of BPSG.

7. The semiconductor device according to claim 1, wherein said first interlayer insulation film is formed of a plurality of layered films, and a first insulator layer on a side nearest to said semiconductor substrate is made of TEOS.

8. The semiconductor device according to claim 5, wherein a second insulator layer formed on said first insulator layer is made of one kind selected from a group of a high-temperature oxide film and a Si-rich oxide film.

9. The semiconductor device according to claim 8, wherein a third insulator layer formed on said second insulator layer is made of a SiN film formed by a pressure-reduced CVD method.

10. The semiconductor device according to claim 5, wherein a second insulator layer formed on said first insulator layer is made of TEOS.

11. A semiconductor device, comprising:
a semiconductor substrate;
an integrated circuit part formed on said semiconductor substrate; and
a guard ring part formed on said semiconductor substrate and surrounding said integrated circuit part to prevent moisture intrusion from the outside,
wherein said integrated circuit part includes:
a gate insulation film formed on said semiconductor substrate;
a gate electrode formed on said gate insulation film; and
a pair of impurity diffusion layers formed in a surface of said semiconductor substrate to sandwich said gate electrode in a plan view,
said guard ring part includes a conductive film formed in the same layer as said gate electrode, and
said semiconductor device further comprises:
a first interlayer insulation film which covers at least said gate electrode and said pair of impurity diffusion layers, and is formed to extend over said integrated circuit part and said guard ring part, and in which a first contact hole reaching at least said gate electrode is formed;
a wiring layer formed on said first interlayer insulation film and connected to at least said gate electrode via said first contact hole; and
second interlayer insulation film formed on said first interlayer insulation film and covering said wiring layer, in said second interlayer insulation film second contact holes reaching said wiring layer being formed in said integrated circuit part
said first and second interlayer insulation films have a trench reaching said conductive film only in said guard ring part and deeper than said second contact holes, and
said trench and said second contact holes have a buried conductive layer buried therein.

12. A manufacturing method of a semiconductor device comprising a semiconductor substrate, an integrated circuit part formed on said semiconductor substrate, and a guard ring part formed on said semiconductor substrate and surrounding said integrated circuit part to prevent moisture intrusion from the outside, said method comprising the steps of:
forming a gate insulation film and a gate electrode on said semiconductor substrate in said integrated circuit part;
forming a pair of impurity diffusion layers in a surface of said semiconductor substrate to sandwich said gate electrode in a plan view;
forming a first interlayer insulation film covering at least said gate electrode and said pair of impurity diffusion layers to extend over said integrated circuit part and said guard ring part;
forming, in said first interlayer insulation film, first contact holes reaching at least said pair of impurity diffusion layers;
forming a wiring layer connected to at least said impurity diffusion layers via said first contact holes on said first interlayer insulation film;
forming a second interlayer insulation film covering said wiring layer on said first interlayer insulation film;
forming a trench reaching said semiconductor substrate in said first and second interlayer insulation films only in said guard ring part and forming second contact holes, in said integrated circuit part, reaching said wiring layer in said second interlayer insulation film, said trench being deeper than said second contact holes; and
burying a buried conductive layer in both of said trench and said second contact holes.

13. The manufacturing method of the semiconductor device according to claim 12, wherein, in said step of forming said trench, said trench is formed in a continuous ring shape.

14. The manufacturing method of the semiconductor device according to claim 12,
wherein, in the step of forming said first interlayer insulation film, said interlayer insulation film is formed to extend over said integrated circuit part, said guard ring part, and a dicing part surrounding said guard ring part,
said step of forming said contact holes includes the step of forming, in said first interlayer insulation film, a plurality of dicing part trench patterns reaching said semiconductor substrate in said dicing part, as well as forming said contact holes, and
in said step of forming said plurality of dicing part trench patterns, each of said plurality of dicing part trench patterns is formed to be shorter in length than the distance to a nearest contact hole among said contact holes.

15. The manufacturing method of the semiconductor device according to claim 12, wherein a film containing at least one kind of element selected from a group of boron and phosphorous is used as said first interlayer insulation film.

16. The manufacturing method of the semiconductor device according to claim 12, wherein said first interlayer insulation film is formed of a plurality of layered films, and a layer containing at least one kind of element selected from a group of boron and phosphorus is used as a first insulator layer on a side nearest to said semiconductor substrate.

17. The manufacturing method of the semiconductor device according to claim 16, wherein said first insulator layer is made of BPSG.

18. The manufacturing method of the semiconductor device according to claim 12, wherein said first interlayer insulation film is formed of a plurality of layered films, and a layer made of TEOS is used as a first insulator layer on a side nearest to said semiconductor substrate.

19. The manufacturing method of the semiconductor device according to claim 16, wherein a second insulator layer formed on said first insulator layer is made of one kind selected from a group of a high-temperature oxide film and a Si-rich oxide film.

20. The manufacturing method of the semiconductor device according to claim 19, wherein a SiN film is formed on said second interlayer insulator layer as a third insulator layer by a pressure-reduced CVD method.

21. The manufacturing method of the semiconductor device according to claim 16, wherein a second interlayer insulator layer formed on said first insulator layer is made of TEOS.

22. A manufacturing method of a semiconductor device comprising a semiconductor substrate, an integrated circuit part formed on said semiconductor substrate, and a guard ring part formed on said semiconductor substrate and surrounding said integrated circuit part to prevent moisture intrusion from the outside, said method comprising the steps of:

forming a gate insulation film and a gate electrode on said semiconductor substrate in said integrated circuit part, and conductive film in the same layer as said gate electrode in said guard ring part;

forming a pair of impurity diffusion layers in a surface of said semiconductor substrate to sandwich said gate electrode in a plan view;

forming a first interlayer insulation film covering at least said gate electrode and said pair of impurity diffusion layers to extend over said integrated circuit part and said guard ring part;

forming, in said first interlayer insulation film, a first contact hole reaching at least said gate electrode;

forming a wiring layer connected to at least said gate electrode via said first contact hole on said first interlayer insulation film;

forming a second interlayer insulation film covering said wiring layer on said first interlayer insulation film;

forming a trench reaching said conductive film in said first and said second interlayer insulation films only in said guard ring part and forming second contact holes, in said integrated circuit part, reaching said wiring layer in said second interlayer insulation film, said trench being deeper than said second contact holes; and burying a buried conductive layer in both of said trench and said second contact holes.

* * * * *